US012757458B2

(12) United States Patent
Park

(10) Patent No.: US 12,757,458 B2
(45) Date of Patent: Oct. 6, 2026

(54) SEMICONDUCTOR DEVICE HAVING SOURCE/DRAIN PATTERN INCLUDING MULTIPLE LAYERS WITH DIFFERENT CONDUCTIVITY TYPE

(71) Applicant: SAMSUNG ELECTRONICS CO., LTD., Suwon-si (KR)

(72) Inventor: Soon Yeol Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 360 days.

(21) Appl. No.: 18/534,824

(22) Filed: Dec. 11, 2023

(65) Prior Publication Data

US 2024/0379760 A1 Nov. 14, 2024

(30) Foreign Application Priority Data

May 9, 2023 (KR) ........................ 10-2023-0060000

(51) Int. Cl.
*H10D 62/13* (2025.01)
*H10D 30/01* (2025.01)
(Continued)

(52) U.S. Cl.
CPC ......... *H10D 62/151* (2025.01); *H10D 30/014* (2025.01); *H10D 30/43* (2025.01);
(Continued)

(58) Field of Classification Search
CPC ................. H10D 30/01; H10D 30/014; H10D 30/019–0198; H10D 30/0273; H10D 30/43; H10D 30/435; H10D 30/501–509; H10D 30/6729; H10D 30/6735; H10D 30/674; H10D 30/6757; H10D 30/797; H10D 62/121; H10D 62/149; H10D 62/151; H10D 64/017; H10D 64/018; H10D 84/017; H10D 84/0193; H10D 84/8311;
(Continued)

(56) References Cited

U.S. PATENT DOCUMENTS 8,368,127 B2 2/2013 Zhu et al.
9,391,204 B1 7/2016 Cheng et al.
(Continued)

FOREIGN PATENT DOCUMENTS

KR 10-2015-0005584 1/2015

*Primary Examiner* — Cheung Lee
(74) *Attorney, Agent, or Firm* — MORGAN, LEWIS & BOCKIUS LLP

(57) ABSTRACT

A semiconductor device includes: an active pattern which includes a first lower pattern and first sheet patterns, wherein the first lower pattern extends in a first direction, and the plurality of first sheet patterns are spaced apart from the first lower pattern in a second direction crossing the first direction; a gate structure, which includes a gate electrode and a gate spacer extending in a third direction intersecting the first and second directions, disposed on the active pattern; a first source/drain pattern adjacent to a side of the gate structure; and a second source/drain pattern which is spaced apart from the first source/drain pattern with the gate structure interposed therebetween, wherein the first source/drain pattern includes: a lower layer including a first conductivity type and disposed on the first lower pattern, and an upper layer including a second conductivity type, wherein the second source/drain pattern has the second conductivity type.

18 Claims, 32 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |

(52) U.S. Cl.

CPC ..... *H10D 30/6729* (2025.01); *H10D 30/6735* (2025.01); *H10D 62/121* (2025.01); *H10D 64/017* (2025.01); *H10D 64/018* (2025.01); *H10D 84/017* (2025.01); *H10D 84/0193* (2025.01)

(58) Field of Classification Search

CPC ......... H10D 84/8312; H10D 84/83125; H10D 84/83135; H10D 84/8314; H10D 84/8316; H10D 84/834; H10D 84/835; H10D 84/836; H10D 84/837–839

See application file for complete search history.

(56) References Cited

U.S. PATENT DOCUMENTS

| | | | |
|---|---|---|---|
| 10,745,997 | B2 | 8/2020 | Burris et al. |
| 11,101,374 | B1 | 8/2021 | Reznicek et al. |
| 11,158,634 | B1 | 10/2021 | Huang et al. |
| 2021/0183850 | A1 | 6/2021 | Nidhi et al. |
| 2022/0059524 | A1 | 2/2022 | Hsu et al. |
| 2022/0140078 | A1 | 5/2022 | Chung et al. |
| 2022/0285511 | A1 | 9/2022 | Park et al. |

SEMICONDUCTOR DEVICE HAVING SOURCE/DRAIN PATTERN INCLUDING MULTIPLE LAYERS WITH DIFFERENT CONDUCTIVITY TYPE

CROSS-REFERENCE TO RELATED APPLICATION

This application claims priority under 35 USC § 119 to Korean Patent Application No. 10-2023-0060000 filed on May 9, 2023, in the Korean Intellectual Property Office, the disclosure of which is incorporated by reference herein in its entirety.

TECHNICAL FIELD

The present inventive concept relates to a semiconductor device.

DISCUSSION OF THE RELATED ART

To increase the density of a semiconductor device, a multi gate transistor including a multi-channel active pattern (or a silicon body), which has a fin or nanowire shape and is formed on a substrate, and a gate, which is formed on a surface of the multi-channel active pattern, has been under development.

Since such a multi gate transistor may utilize a three-dimensional channel, scaling may be easily performed. Further, even if a gate length of the multi gate transistor is not increased, the current control capability may be increased. Furthermore, a SCE (short channel effect) in which potential of a channel region is influenced by a drain voltage may be effectively suppressed.

SUMMARY

According to some embodiments of the present inventive concept, a semiconductor device includes: an active pattern which includes a first lower pattern and a plurality of first sheet patterns, wherein the first lower pattern extends in a first direction, and the plurality of first sheet patterns are spaced apart from the first lower pattern in a second direction crossing the first direction; a gate structure, which includes a gate electrode and a gate spacer extending in a third direction intersecting the first direction and the second direction, disposed on the active pattern; a first source/drain pattern disposed adjacent to a first side of the gate structure; and a second source/drain pattern which is spaced apart from the first source/drain pattern with the gate structure interposed therebetween, wherein the first source/drain pattern includes; a lower layer including a first conductivity type and disposed on the first lower pattern, and an upper layer including a second conductivity type, which is different from the first conductivity type, and disposed on the lower layer, wherein the second source/drain pattern has the second conductivity type.

According to some embodiments of the present inventive concept, a semiconductor device includes: an active pattern which includes a first lower pattern and a plurality of first sheet patterns, wherein the first lower pattern extends in a first direction, and the plurality of first sheet patterns are spaced apart from the first lower pattern in a second direction; a gate structure, which includes a gate electrode and a gate spacer extending in a third direction intersecting the first direction and the second direction, disposed on the active pattern; a first source/drain pattern disposed adjacent to a first side of the gate structure; and a second source/drain pattern which is spaced apart from the first source/drain pattern with the gate structure interposed therebetween, wherein the first source/drain pattern includes: a first layer including a first conductivity type; and a second layer including a second conductivity type different from the first conductivity type, wherein the second source/drain pattern has the second conductivity type, and wherein side surfaces of the plurality of first sheet patterns are in contact with the first layer and the second source/drain pattern, and are spaced apart from the second layer.

According to some embodiments of the present inventive concept, a semiconductor device includes: an active pattern which includes a first lower pattern and a plurality of first sheet patterns, wherein the first lower pattern extends in a first direction, and the plurality of first sheet patterns are spaced apart from the first lower pattern in a second direction crossing the first direction; a gate structure, which includes a gate electrode and a gate spacer extending in a third direction intersecting the first direction and the second direction, disposed on the active pattern; a first source/drain pattern disposed adjacent to a first side of the gate structure; a second source/drain pattern which is spaced apart from the first source/drain pattern with the gate structure interposed therebetween; a first source/drain contact disposed on the first source/drain pattern; and an internal spacer which is disposed between the plurality of first sheet patterns in the second direction, and is disposed between the first source/drain pattern and the gate electrode in the first direction, and between the second source/drain pattern and the gate electrode, wherein the first source/drain pattern includes: a first layer including a first conductive type and disposed on the first lower pattern; a second layer including a second conductivity type, which is different from the first conductivity type, and disposed on the first layer; and a third layer including the first conductivity type and disposed on the second layer, wherein the second source/drain pattern has the second conductivity type, wherein the first layer surrounds a side surface and a lower surface of the second layer, wherein the third layer covers an upper surface of the second layer, and wherein the first source/drain contact penetrates the third layer, and a lower surface of the first source/drain contact is disposed inside the second layer.

BRIEF DESCRIPTION OF THE DRAWINGS

The above and features of the present inventive concept will become more apparent by describing in detail embodiments thereof with reference to the attached drawings, in which.

DETAILED DESCRIPTION OF THE EMBODIMENTS

Figure 1:
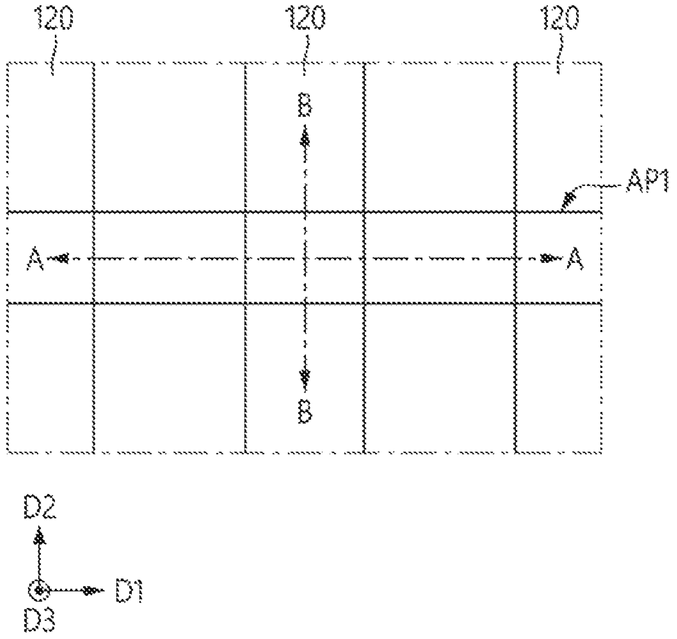
FIG. 1 is a layout diagram illustrating a semiconductor device according to some embodiments of the present inventive concept.

In the figures and the specification, like reference numerals may denote like elements or features, and thus their descriptions may be omitted.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit, idea, and scope of the present inventive concept.

As used herein, the singular forms are intended to include the plural forms as well, unless the context clearly indicates otherwise.

A semiconductor device according to some embodiments of the present inventive concept may include, for example, a fin-type transistor (FinFET), a tunneling transistor (tunneling FET), a three-dimensional (3D) transistor or a vertical transistor (Vertical FET). The semiconductor device according to some embodiments of the present inventive concept may include a planar transistor. In addition, the technical idea of the present inventive concept may be applied to a transistor based on two-dimensional material (2D material based FETs) and a heterostructure thereof.

Further, the semiconductor device according to some embodiments of the present inventive concept may include a bipolar junction transistor, a laterally diffused metal oxide semiconductor (LDMOS), or the like.

Hereinafter, embodiments of the present inventive concept will be described with reference to the accompanying drawings.

Figure 2:
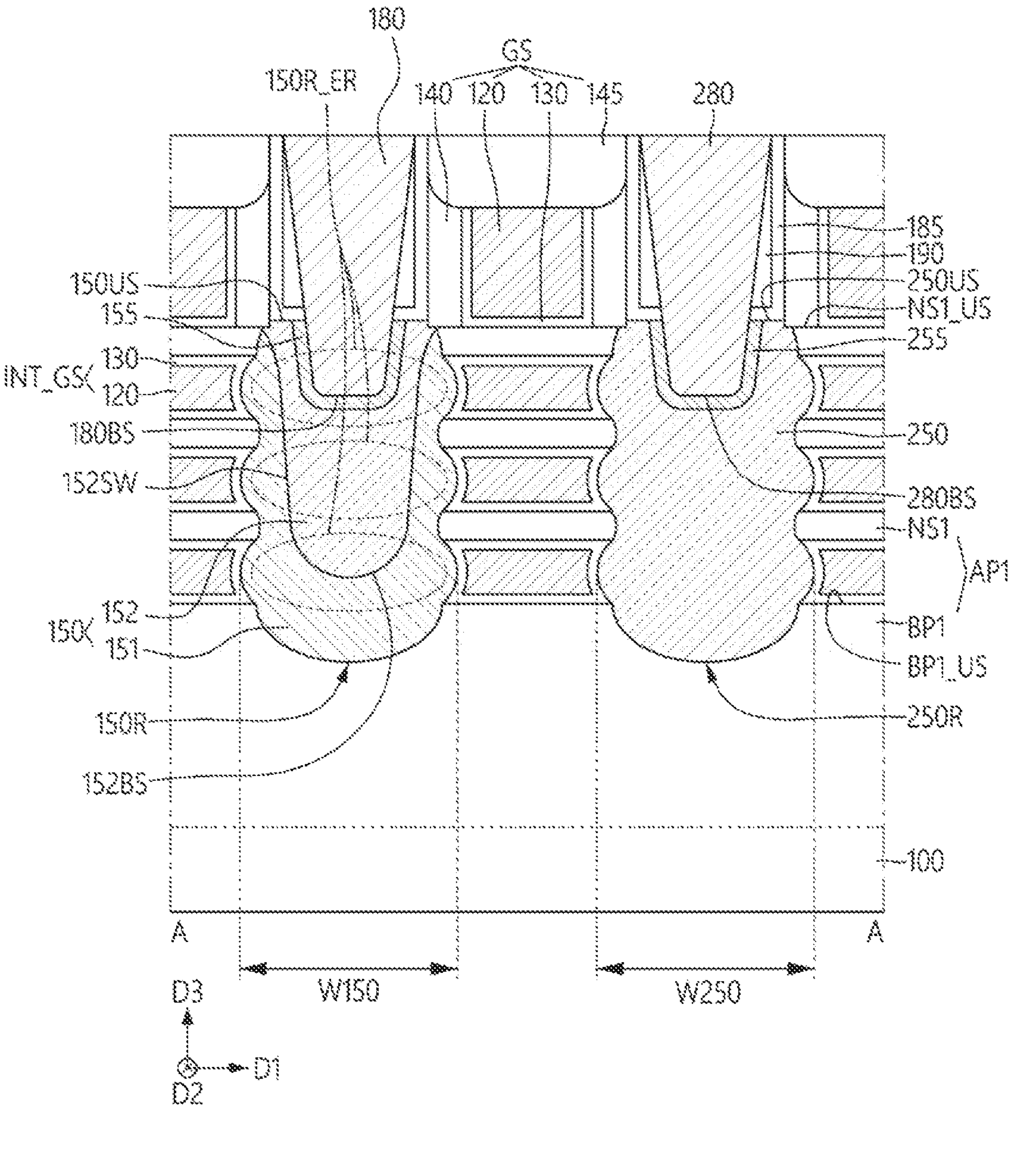
FIG. 2 is a cross-sectional view taken along A-A of FIG. 1.
Figure 3:
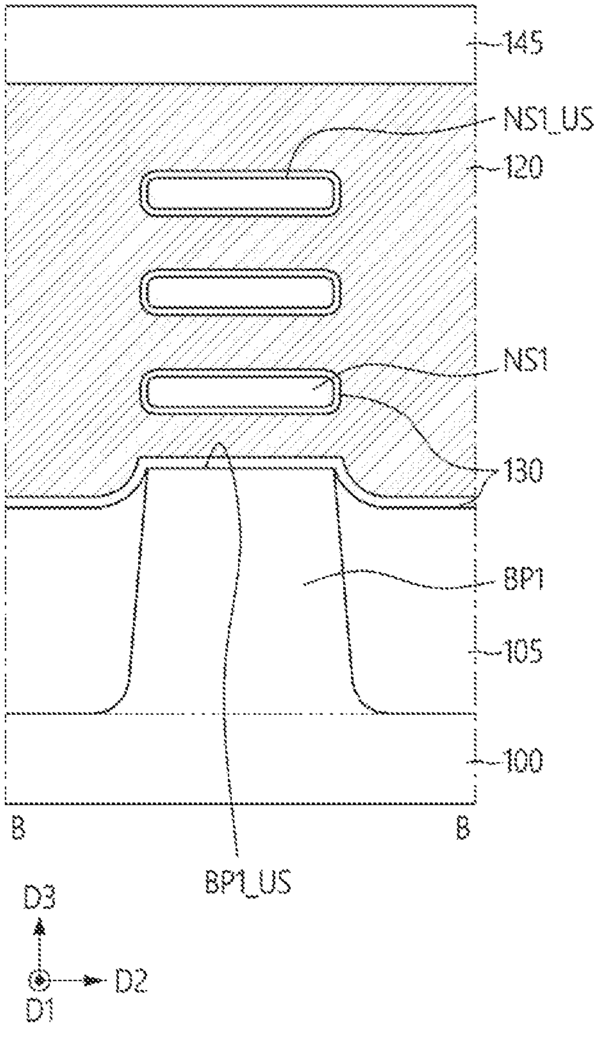
FIG. 3 is a cross-sectional view taken along B-B of FIG. 1.

FIG. 1 is a layout diagram illustrating a semiconductor device according to some embodiments of the present inventive concept. FIG. 2 is a cross-sectional view taken along A-A of FIG. 1. FIG. 3 is a cross-sectional view taken along B-B of FIG. 1.

Referring to FIGS. 1 to 3, a semiconductor device according to some embodiments of the present inventive concept may include a first active pattern AP1, a plurality of first gate electrodes 120, a first source/drain pattern 150, and a second source/drain pattern 250.

A substrate 100 may be a bulk silicon or a silicon-on-insulator (SOI). In addition, the substrate 100 may be a silicon substrate, or may include other materials, for example, but are not limited to, silicon germanium, SGOI (silicon germanium on insulator), indium antimonide, lead tellurium compounds, indium arsenide, indium phosphide, gallium arsenide and/or gallium antimonide.

A first active pattern AP1 may be placed on the substrate 100. The first active patterns AP1 may each extend long in a first direction D1.

As an example, the first active pattern AP1 may be placed in a region in which an NMOS is formed. As another example, the first active pattern AP1 may be placed in a region in which a PMOS is formed. In the following description, the first active pattern AP1 will be explained as being placed in the region in which the NMOS is formed. That is, the contents that are to be explained below may be applied to the region in which the PMOS is formed.

The first active pattern AP1 may be, for example, a multi-channel active pattern. The first active pattern AP1 may include a first lower pattern BP1 and a plurality of first sheet patterns NS1.

The first lower pattern BP1 may protrude from the substrate 100. The first lower pattern BP1 may extend long in the first direction D1.

A plurality of first sheet patterns NS1 may be placed on an upper face BP1_US of the first lower pattern. The plurality of first sheet patterns NS1 may be spaced apart from the first lower pattern BP1 in a third direction D3. Each first sheet pattern NS1 may be spaced apart from each other in the third direction D3.

The third direction D3 may be a direction that intersects the first direction D1 and a second direction D2. For example, the third direction D3 may be a thickness direction of the substrate 100. The first direction D1 may be a direction that intersects the second direction D2.

Although three first sheet patterns NS1 are shown as being placed in the third direction D3, this is an example and the present inventive concept is not limited thereto. For example, the four first sheet patterns NS1 may be placed in the third direction D3.

The first lower pattern BP1 may be formed by etching a part of the substrate 100, and may include an epitaxial layer grown from the substrate 100. The first lower pattern BP1 may include, for example, silicon or germanium, which is an elemental semiconductor material. In addition, the first lower pattern BP1 may include a compound semiconductor, and may include, for example, a group IV-IV compound semiconductor or a group III-V compound semiconductor.

The group IV-IV compound semiconductor may include, for example, a binary compound or a ternary compound including at least two or more of, for example, carbon (C), silicon (Si), germanium (Ge), and tin (Sn), or a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

For example, the first lower pattern BP1 may be made up of a semiconductor material. An upper face BP1_US of the first lower pattern may be made up of a semiconductor material.

The first sheet pattern NS1 may include, for example, one of silicon or germanium which is an elemental semiconductor material, a group IV-IV compound semiconductor, and/or a group III-V compound semiconductor. Each first sheet pattern NS1 may include the same material as the first lower pattern BP1, or may include a material different from that of the first lower pattern BP1.

The first sheet pattern NS1 might not include P-type impurities or N-type impurities. For example, the first sheet pattern NS1 may include only silicon. The first sheet pattern NS1 might not have conductivity.

In the semiconductor device according to some embodiments of the present inventive concept, the first lower pattern BP1 may be a silicon lower pattern including silicon, and the first sheet pattern NS1 may be a silicon sheet pattern including silicon.

A width of the first sheet pattern NS1 in the second direction D2 may increase or decrease in proportion to a width of the first lower pattern BP1 in the second direction D2. As an example, although the first sheet patterns NS1 stacked in the third direction D3 are shown to have the same width in the second direction D2, the present inventive concept is not limited thereto. Unlike the shown example, the width in the second direction D2 of the first sheet patterns NS1 stacked in the third direction D3 may decrease as it goes away from the first lower pattern BP1.

A field insulating film 105 may be formed on the substrate 100. The field insulating film 105 may be placed on side walls of the first lower pattern BP1. The field insulating film 105 is not placed on the upper face BP1_US of the first lower pattern BP1.

As an example, the field insulating film 105 may entirely cover the side walls of the first lower pattern BP1. As an example, the field insulating film 105 may partially cover the side walls of the first lower pattern BP1. In this case, a part of the first lower pattern BP1 may protrude from the upper face of the field insulating film 105 in the third direction D3.

Each first sheet pattern NS1 is placed to be higher than the upper face of the field insulating film 105. The field insulating film 105 may include, for example, an oxide film, a nitride film, an oxynitride film or a combination film thereof. Although the field insulating film 105 is shown as a single film, the present inventive concept is not limited thereto.

A plurality of gate structures GS may be placed on the substrate 100. Each gate structure GS may extend in the second direction D2. The gate structures GS may be placed to be spaced apart from each other in the first direction D1. The gate structures GS may be adjacent to each other in the first direction D1. For example, the gate structures GS may be placed adjacent to sides of the first source/drain pattern 150 in the first direction D1. For example, the first source/drain pattern 150 may be disposed between adjacent gate structures GS. For example, the gate structures GS may be placed adjacent to sides of the second source/drain pattern 250 in the first direction D1. For example, the second source/drain pattern 250 may be disposed between adjacent gate structures GS.

The gate structure GS may be placed on the first active pattern AP1. The gate structure GS may intersect the first active pattern AP1.

The gate structure GS may intersect the first lower pattern BP1. The gate structure GS may at least partially surround each sheet pattern NS. For example, the gate structure GS may wrap each sheet pattern NS.

The gate structure GS may include, for example, a gate electrode 120, a first gate insulating film 130, a first gate spacer 140, and a first gate capping pattern 145.

The gate structure GS may include a plurality of inner gate structures INT_GS placed between the first sheet patterns NS1 adjacent to each other in the third direction D3, and between the first lower pattern BP1 and the first sheet pattern NS. The inner gate structures INT_GS may be placed between the upper face BP1_US of the first lower pattern BP1 and the lower face of the lowermost first sheet pattern NS1, and between the upper face of the first sheet pattern NS1 and the lower face of the first sheet pattern NS1 facing each other in the third direction D3.

The number of inner gate structures INT_GS may be proportional to the number of sheet patterns NS included in the active pattern AP1. For example, the number of inner gate structures INT_GS may be the same as the number of first sheet patterns NS1. Since the first active pattern AP1 includes a plurality of first sheet patterns NS1, the gate structure GS may include a plurality of inner gate structures.

The inner gate structures INT_GS may be disposed on the upper face BP1_US of the first lower pattern BP1, the upper face of the first sheet pattern NS1, and the lower face of the first sheet pattern NS1.

For example, the inner gate structure INT_GS may be in contact with the upper face BP1_US of the first lower pattern, the upper face of the first sheet pattern NS1, and the lower face of the first sheet pattern NS1.

The inner gate structure INT_GS may be disposed on a portion of each of a first source/drain pattern 150 and a second source/drain pattern 250 which will be explained below. For example, the inner gate structure INT_GS may be in direct contact with the first source/drain pattern 150 and the second source/drain pattern 250.

The following description will be made using a case where the number of inner gate structures INT_GS is three.

The inner gate structure INT_GS may include a first inner gate structure, a second inner gate structure, and a third inner gate structure. The first inner gate structure, the second inner gate structure and the third inner gate structure may be sequentially placed on the first lower pattern BP1.

The third inner gate structure may be placed between the first lower pattern BP1 and the first sheet pattern NS1. The third inner gate structure may be placed at the lowermost part of the inner gate structure INT_GS. The third inner gate structure may be in contact with the upper face BP1_US of the first lower pattern.

The first inner gate structure and the second inner gate structure may be placed between the first sheet patterns NS1 adjacent to each other in the third direction D3. The first inner gate structure may be placed at the uppermost part of the inner gate structure INT_GS. The first inner gate structure may be in contact with the lower face of the first sheet pattern NS1 placed at the uppermost part of the first nano sheet patterns NS1. The second inner gate structure may be placed between the first inner gate structure and the third inner gate structure.

The inner gate structure INT_GS includes a first gate electrode 120 and a first gate insulating film 130 placed between the adjacent first sheet patterns NS1, and between the first lower pattern BP1 and the first sheet pattern NS1.

For example, a width of the first inner gate structure in the first direction D1 may be substantially the same as a width of the second inner gate structure in the first direction D1. A width of the third inner gate structure in the first direction D1 may be substantially the same as a width of the second inner gate structure in the first direction D1.

As another example, the width of the third inner gate structure in the first direction D1 may be greater than the width of the second inner gate structure in the first direction D1. For example, the width of the first inner gate structure in the first direction D1 may be substantially the same as the width of the second inner gate structure in the first direction D1.

The second inner gate structure will be explained as an example. The width of the second inner gate structure may be measured between the upper face of the first sheet pattern NS1 and the lower face of another first sheet pattern NS1, which face each other in the third direction D3.

The first gate electrode 120 (or, e.g., a portion of the gate electrode 120) may be formed on the first lower pattern BP1. The first gate electrode 120 may intersect the first lower pattern BP1. The first gate electrode 120 may at least partially surround the first sheet pattern NS1.

A part of the first gate electrode 120 may be placed between the first sheet patterns NS1 adjacent to each other in the third direction D3. When the first sheet pattern NS1 includes a lower sheet pattern and an upper sheet pattern adjacent to each other in the third direction D3, a part of the first gate electrode 120 may be placed between the upper face of the lower sheet pattern and the lower face of the upper sheet pattern, which face each other. In addition, a part of the first gate electrode 120 may be placed between the upper face BP1_US of the first lower pattern BP1 and the lower face of the lowermost sheet pattern.

The first gate electrode 120 may include at least one of, for example, metal, metal alloy, conductive metal nitride, metal silicide, doped semiconductor material, conductive metal oxide and conductive metal oxynitride. The first gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxide and the conductive metal oxynitride may include, but are not limited to, for example, an oxidized form of the aforementioned materials.

The first gate electrode 120 may be placed on both sides of a first source/drain pattern 150, which will be explained below. The gate structures GS may be placed adjacent to sides of the first source/drain pattern 150 in the first direction D1. The first gate electrode 120 may be placed adjacent to sides of a second source/drain pattern 250, which will be explained below. The gate structures GS may be placed on adjacent to sides of the second source/drain pattern 250 in the first direction D1.

As an example, both the first gate electrodes 120 placed on both sides of the first source/drain pattern 150 may be gate electrodes used as a gate of a transistor. As another example, the first gate electrode 120 placed on one side of the first source/drain pattern 150 may be used as the gate of the transistor, but the first gate electrode 120 placed on the other side of the first source/drain pattern 150 may be a dummy gate electrode.

Both the first gate electrodes 120 placed on both sides of the second source/drain pattern 250 may be gate electrodes used as gates of the transistor. As another example, the first gate electrode 120 placed on one side of the second source/drain pattern 250 may be used as the gate of the transistor, but the first gate electrode 120 placed on the other side of the second source/drain pattern 250 may be a dummy gate electrode.

The first gate insulating film 130 may extend along the upper face of the field insulating film 105 and the upper face BP1_US of the first lower pattern BP1. The first gate insulating film 130 may at least partially surround the plurality of first sheet patterns NS1. The first gate insulating film 130 may be placed along the periphery of the first sheet pattern NS1. The first gate electrode 120 is placed on the first gate insulating film 130. The first gate insulating film 130 is placed between the first gate electrode 120 and the first sheet pattern NS1. A part of the first gate insulating film 130 may be placed between the first sheet patterns NS1 adjacent in the third direction D3, and between the first lower pattern BP1 and the first sheet pattern NS1.

A part of the first gate insulating film 130 may be placed between the first sheet patterns NS1 adjacent in the third direction D3, and between the first lower pattern BP1 and the first sheet pattern NS1. When the first sheet pattern NS1 includes a lower sheet pattern and an upper sheet pattern adjacent to each other in the third direction D3, a part of the first gate insulating film 130 may extend along the upper face of the lower sheet pattern and the lower face of the upper sheet pattern that face each other.

The first gate insulating film 130 may include, for example, silicon oxide, silicon-germanium oxide, germanium oxide, silicon oxynitride, silicon nitride or a high dielectric constant material having a dielectric constant higher than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Although the first gate insulating film 130 is shown as a single film, and the present inventive concept is not limited thereto. For example, the first gate insulating film 130 may include a plurality of films. The first gate insulating film 130 may include an interfacial layer and a high dielectric constant insulating film placed between the first sheet pattern NS1 and the first gate electrode 120.

A semiconductor device according to some embodiments of the present inventive concept may include an NC (Negative Capacitance) FET that uses a negative capacitor. For example, the first gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. In addition, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below about 60 mV/decade at about room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include about 3 at % to about 8 at % (atomic %) aluminum. Here, a ratio of the dopant may be a ratio of aluminum to the sum of hafnium and aluminum.

When the dopant is silicon (Si), the ferroelectric material film may include about 2 at % to about 10 at % silicon. When the dopant is yttrium (Y), the ferroelectric material film may include about 2 at % to about 10 at % yttrium. When the dopant is gadolinium (Gd), the ferroelectric material film may include about 1 at % to about 7 at % gadolinium. When the dopant is zirconium (Zr), the ferroelectric material film may include about 50 at % to about 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and/or aluminum oxide.

The ferroelectric material film and the paraelectric material film may include the same material as each other. The ferroelectric material film has the ferroelectric properties, but the paraelectric material film might not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, for example, but is not limited to, about 0.5 to about 10 nm. Since a critical thickness that exhibits the ferroelectric properties may vary for each ferroelectric material, the thickness of the ferroelectric material film may vary depending on the ferroelectric material.

As an example, the first gate insulating film 130 may include one ferroelectric material film. As another example, the first gate insulating film 130 may include a plurality of ferroelectric material films that are spaced apart from each other. The first gate insulating film 130 may have a stacked film structure in which the plurality of ferroelectric material films and the plurality of paraelectric material films are alternately stacked on each other.

The first gate spacer 140 may be placed on the side wall of the first gate electrode 120. The first gate spacer 140 might not be placed between the first lower pattern BP1 and the first sheet pattern NS1, and between the first sheet patterns NS1 that are adjacent to each other in the third direction D3. In the semiconductor device according to some embodiments of the present inventive concept, the first gate spacer 140 may include an external spacer.

The first gate spacer 140 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof. Although the first gate spacer 140 is shown to be a single film, this is an example and the present inventive concept is not limited thereto.

A first gate capping pattern 145 may be placed on the first gate electrode 120 and the first gate spacer 140. An upper face of the first gate capping pattern 145 may be substantially coplanar with an upper face of the interlayer insulating film 190. The first gate capping pattern 145 may be placed between the first gate spacers 140, unlike the shown example.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity with respect to the interlayer insulating film 190.

A first source/drain pattern 150 and a second source/drain pattern 250 may be placed on the first active pattern AP1. The first source/drain pattern 150 and the second source/drain pattern 250 may be placed on the first lower pattern BP1. The first source/drain pattern 150 and the second source/drain pattern 250 are connected to the first sheet pattern NS1. For example, the first source/drain pattern 150 and the second source/drain pattern 250 are in contact with the first sheet pattern NS1.

The first source/drain pattern 150 and the second source/drain pattern 250 may be placed adjacent to side faces (e.g., side surfaces) of the gate structure GS. The first source/drain pattern 150 and the second source/drain pattern 250 may be spaced apart from each other with the gate structure GS interposed therebetween. The first source/drain pattern 150 and the second source/drain pattern 250 may each be placed between the gate structures GS adjacent in the first direction D1. For example, the first source/drain pattern 150 may be placed on both sides of the gate structure GS. As another example, the first source/drain pattern 150 is placed on one side of the gate structure GS, and is not placed on the other side of the gate structure GS.

The upper face 150US of the first source/drain pattern and the upper face 250US of the second source/drain pattern may be placed above the upper face NS1_US of the first sheet pattern NS1 placed at the uppermost part of the first sheet patterns NS1. For example, on the basis of the upper face BP1_US of the first lower pattern BP1, the upper face 150US of the first source/drain pattern 150 and the upper face 250US of the second source/drain pattern 250 may have a height higher than that of the upper face NS1_US of the first sheet pattern NS1 placed at the uppermost part of the first sheet patterns NS1.

The first source/drain pattern 150 and the second source/drain pattern 250 may be included in the source/drain of the transistor that uses the first sheet pattern NS1 as the channel region of the gate structure GS. For example, the first source/drain pattern 150 may correspond to the source region of a transistor that uses the first sheet pattern NS1 as a channel region. The second source/drain pattern 250 may correspond to a drain region of a transistor that uses the first sheet pattern NS1 as a channel region.

The first source/drain pattern 150 may be placed inside the first source/drain recess 150R. The first source/drain pattern 150 may fill the source/drain recess 150R. The second source/drain pattern 250 may be placed inside the second source/drain recess 250R. The second source/drain pattern 250 may fill the second source/drain recess 250R.

The first source/drain recess 150R and the second source/drain recess 250R extend in the third direction D3. The first source/drain recess 150R and the second source/drain recess 250R may each be defined between the gate structures GS that are adjacent to each other in the first direction D1.

The first source/drain recess 150R and the second source/drain recess 250R may have the same size. For example, the widths of the first source/drain recess 150R and the second source/drain recess 250R in the first direction D1 may be substantially the same as each other. As another example, the depths of the first source/drain recess 150R and the second source/drain recess 250R may be substantially the same as each other, on the basis of the uppermost face NS1_US of the first sheet pattern NS1 in the third direction D3. For example, the bottom faces of the first source/drain recesses 150R and the second source/drain recesses 250R may have substantially the same height as each other on the basis of the upper face BP1_US of the first lower pattern BP1.

Bottom faces of the first source/drain recess 150R and the second source/drain recess 250R may be defined by the first lower pattern BP1. In the semiconductor device according to some embodiments of the present inventive concept, side walls of the first source/drain recess 150R and the second source/drain recess 250R may be defined by the first sheet pattern NS1 and the inner gate structure INT_GS. The side walls of the inner gate structure INT_GS may define some parts of the side walls of the first source/drain recess 150R and the second source/drain recess 250R.

Between the first sheet pattern NS1 at the lowermost part of the first sheet patterns NS1 and the first lower pattern BP1, a boundary between the first gate insulating film 130 and the first lower pattern BP1 may be the upper face BP1_US of the first lower pattern BP1. The upper face BP1_US of the first lower pattern BP1 may be a boundary between the lowermost inner gate structure and the first lower pattern BP1. The bottom faces of the first source/drain recess 150R and the second source/drain recess 250R may be lower than the upper face BP1_US of the first lower pattern BP1.

The side walls of the first source/drain recess 150R and the second source/drain recess 250R may have a wavy shape or round portions. For example, the first source/drain recess 150R may include a plurality of width extension regions 150R_ER. The width extension regions 150R_ER of each first source/drain recess 150R may be defined above the upper face BP1_US of the first lower pattern BP1. Similarly, the second source/drain recess 250R may include a plurality of width extension regions.

The width extension region 150R_ER of the first source/drain recess 150R may be defined between the first sheet patterns NS1 that are adjacent to each other in the third direction D3. The width extension region 150R_ER of the first source/drain recess may be defined between the first lower pattern BP1 and the first sheet pattern NS1. The width extension region 150R_ER of the first source/drain recess 150R may extend between the first sheet patterns NS1 that are adjacent to each other in the third direction D3. The width extension region 150R_ER of the first source/drain recess 150R may be defined between inner gate structures INT_GS that are adjacent to each other in the first direction D1.

The width extension region 150R_ER of each first source/drain recess 150R may have a portion in which the width in the first direction D1 increases and a portion in which the width in the first direction D1 decreases, as it goes away from the upper face BP1_US of the first lower pattern BP1. For example, the width of the width extension region 150R_ER of the first source/drain recess 150R may increase and then decrease, as it goes away from the upper face BP1_US of the first lower pattern BP1.

In each first source/drain recessed width extension region 150R_ER, a point in which the width of the width extension region 150R_ER of the first source/drain recess is maximum is located between the first sheet pattern NS1 and the first lower pattern BP1, or between the first sheet patterns NS1 adjacent to each other in the third direction D3.

The first source/drain pattern 150 may have a first source/drain width W150. The first source/drain width W150 may refer to a width of a point at which the width of the width extension region 150R_ER of the first source/drain recess is maximum. The second source/drain pattern 250 may have a second source/drain width W250. Similarly, the second source/drain width W250 may refer to a width of a point at which the width of the width extension region of the second source/drain recess is maximum. The first source/drain width W150 and the second source/drain width W250 may be substantially the same as each other.

The first source/drain pattern 150 and the second source/drain pattern 250 may be in contact with the first sheet pattern NS1 and the first lower pattern BP1. Since the first gate spacers 140 are not placed between the first sheet patterns NS1 that are adjacent to each other in the third direction D3, and between the first lower pattern BP1 and the first sheet pattern NS1, the inner gate structure INT_GS may be in contact with the first source/drain pattern 150 and the second source/drain pattern 250. The first gate insulating film 130 of the inner gate structure INT_GS may be in contact with the first source/drain pattern 150 and the second source/drain pattern 250.

The first source/drain pattern 150 and the second source/drain pattern 250 may include epitaxial patterns. The first source/drain pattern 150 and the second source/drain pattern 250 may include a semiconductor material.

The first source/drain pattern 150 and the second source/drain pattern 250 may each include, for example, silicon and/or germanium which is an elemental semiconductor material. In addition, the first source/drain pattern 150 and the second source/drain pattern 250 may each include, for example, a binary compound or a ternary compound including at least two or more of carbon ©, silicon (Si), germanium (Ge), and/or tin (Sn), or a compound obtained by doping these elements with a group IV element. For example, the first source/drain pattern 150 and the second source/drain pattern 250 may each include, but are not limited to, silicon, silicon-germanium, silicon carbide, and the like.

The first source/drain pattern 150 may include a first layer 151 and a second layer 152. For example, the first layer 151 may be a lower layer. The first layer 151 may be placed on the first lower pattern BP1. The second layer 152 may be placed on the first layer 151. For example, the second layer 152 may be an upper layer. The first layer 151 may cover the bottom face and inner side faces of the first source/drain recess 150R. The first layer 151 may at least partially surround the lower face 152BS and side faces 152SW of the second layer 152. The first layer 151 may be in contact with the first sheet pattern NS1. The first layer 151 may be in contact with the inner gate structure INT_GS. The first layer 151 may be placed between the second layer 152 and the first sheet pattern NS1. The second layer 152 might not be in contact with the first sheet pattern NS1. The second layer 152 might not be in contact with the inner gate structure INT_GS.

The first layer 151 and the second layer 152 may include different materials from each other. The first layer 151 and the second layer 152 may have different conductivity types from each other. The first layer 151 may have a first conductivity type, and the second layer 152 may have a second conductivity type. For example, the first layer 151 may have an N-type and the second layer 152 may have a P-type. As another example, the first layer 151 may have a P-type and the second layer 152 may have an N-type.

The second layer 152 may overlap the plurality of first sheet patterns NS1 in the first direction D1. For example, the lower face 152BS of the second layer may be placed at the same height as or below the lower face of the first sheet pattern NS1 placed at the lowermost part of the first sheet patterns NS1. Although the second layer 152 is only shown as overlapping the entire plurality of first sheet patterns NS1 in the first direction D1, the embodiments of the present inventive concept are not limited thereto. For example, the second layer 152 might not overlap the first sheet pattern NS1 placed at the lowermost part of the plurality of first sheet patterns NS1 in the first direction D1. For example, the lower face 152BS of the second layer 152 may be placed above the lower face of the first sheet pattern NS1 placed at the lowermost part of the first sheet patterns NS1.

The second source/drain pattern 250 may have one conductivity type. For example, the second source/drain pattern 250 may be a P-type. As another example, the second source/drain pattern 250 may be an N-type. Although the second source/drain pattern 250 is shown to be a single film, the embodiments of the present inventive concept are not limited thereto. For example, the second source/drain pattern 250 may include a plurality of films of the same conductivity type.

The second layer 152 of the first source/drain pattern 150 may have the same conductivity type as that of the second source/drain pattern 250. The second layer 152 and the second source/drain pattern 250 may have the second conductivity type. For example, both the second layer 152 and the second source/drain pattern 250 may be an N-type. As another example, both the second layer 152 and the second source/drain pattern 250 may be a P-type.

The first gate electrode 120, the first sheet pattern NS1, the first source/drain pattern 150 and the second source/drain pattern 250 may form a transistor. For example, if the transistor is an NMOS, the second layer 152 of the first source/drain pattern 150 and the second source/drain pattern 250 may be an N-type, and the first layer 151 of the first source/drain pattern 150 may be a P-type. As another example, if the transistor is a PMOS, the second layer 152 of the first source/drain pattern 150 and the second source/drain pattern 250 may be a P-type, and the first layer 151 of the first source/drain pattern 150 may be an N-type.

The first source/drain pattern 150 may include a first layer 151 and a second layer 152 of conductivity types that are opposite to each other. In the case of a tunneling field effect transistor, carriers may tunneled by forming a narrow energy bandgap between the source and the channel. However, the tunneling field effect transistor has a low on-current and may have degraded characteristics. Therefore, the first source/drain pattern 150 including the first layer 151 and the second layer 152 of opposite conductivity types to each other may give a stress effect on the channel, thereby alleviating the on-current reduction characteristics.

The source/drain etching stop film 185 may extend along the outer side wall of the first gate spacer 140 and the profiles of the first source/drain pattern 150 and the second source/drain pattern 250. For example, the source/drain etching stop film 185 may be disposed on the upper face 150US of the first source/drain 150 and the upper face 250US of the second source/drain 250. The source/drain etching stop film 185 may be placed on the upper face of the field insulating film 105.

The source/drain etching stop film 185 may include a material having an etching selectivity with respect to the interlayer insulating film 190, which will be explained later. The source/drain etching stop film 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating film 190 may be placed on the source/drain etching stop film 185. The interlayer insulating film 190 may be placed on the first source/drain pattern 150 and the second source/drain pattern 250. The interlayer insulating film 190 might not cover the upper face of the first gate capping pattern 145. For example, the upper face of the interlayer insulating film 190 may be placed on substantially the same plane as the upper face of the first gate capping pattern 145.

The interlayer insulating film 190 may include, for example, at least one of silicon oxide, silicon nitride, silicon oxynitride, and/or a low dielectric constant material. The low dielectric constant material may include, for example, but is not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

A first source/drain contact 180 may be placed on the first source/drain pattern 150. The first source/drain contact 180 may be connected to the first source/drain pattern 150. The first source/drain contact 180 passes through the interlayer insulating film 190 and the source/drain etching stop film 185, and may be connected to the first source/drain pattern 150.

A second source/drain contact 280 may be placed on the second source/drain pattern 250. The second source/drain contact 280 may be connected to the second source/drain pattern 250. The second source/drain contact 280 passes through the interlayer insulating film 190 and the source/drain etching stop film 185, and may be connected to the second source/drain pattern 250.

A first metal silicide film 155 may be placed between the first source/drain contact 180 and the first source/drain pattern 150. A second metal silicide film 255 may be placed between the second source/drain contact 280 and the second source/drain pattern 250. The first metal silicide film 155 and the second metal silicide film 255 may at least partially surround the lower face 180BS of the first source/drain contact and the lower face 280BS of the second source/drain contact, respectively. The first metal silicide film 155 and the second metal silicide film 255 may each include metal silicide.

For example, on the basis of the upper face BP1_US of the first lower pattern BP1, the height of the lower face 180BS of the first source/drain contact 180 may be substantially the same as or higher than the height of the lower face of the first sheet pattern NS1 that is placed at the uppermost part of the first sheet patterns NS1. As another example, the lower face 180BS of the first source/drain contact 180 may be located between the upper face of the first sheet pattern NS1 placed at the lowermost part of the first sheet patterns NS1 and the lower face of the first sheet pattern placed at the uppermost part of the first sheet patterns NS1.

The first source/drain contact 180 may extend to the second layer 152 in the third direction D3. For example, the first source/drain contact 180 may penetrate the second layer 152 in the third direction D3. The first source/drain contact 180 might not extend to the first layer 151. The first source/drain contact 180 might not be in contact with the first layer 151.

The lower face 180BS of the first source/drain contact 180 and the lower face 280BS of the second source/drain contact 280 may have the same height as each other.

The lower face 180BS of the first source/drain contact 180 may be placed inside the second layer 152 on the basis of the upper face BP1_US of the first lower pattern BP1. The lower face 180BS of the first source/drain contact 180 may be at least partially surrounded by the second layer 152.

Although the first source/drain contact 180 and the second source/drain contact 280 are shown to be single films, this example and the present inventive concept is not limited thereto. The first source/drain contact 180 and the second source/drain contact 280 include, for example, at least one of metal, metal alloy, conductive metal nitride, conductive metal carbide, conductive metal oxide, conductive metal carbonitride, and a two-dimensional material (2D material).

FIGS. 4 to 11 are diagrams illustrating a semiconductor device according to some embodiments of the present inventive concept. For convenience of explanation, the points different from contents explained referring to FIGS. 1 to 3 will be mainly explained.

Figure 4:
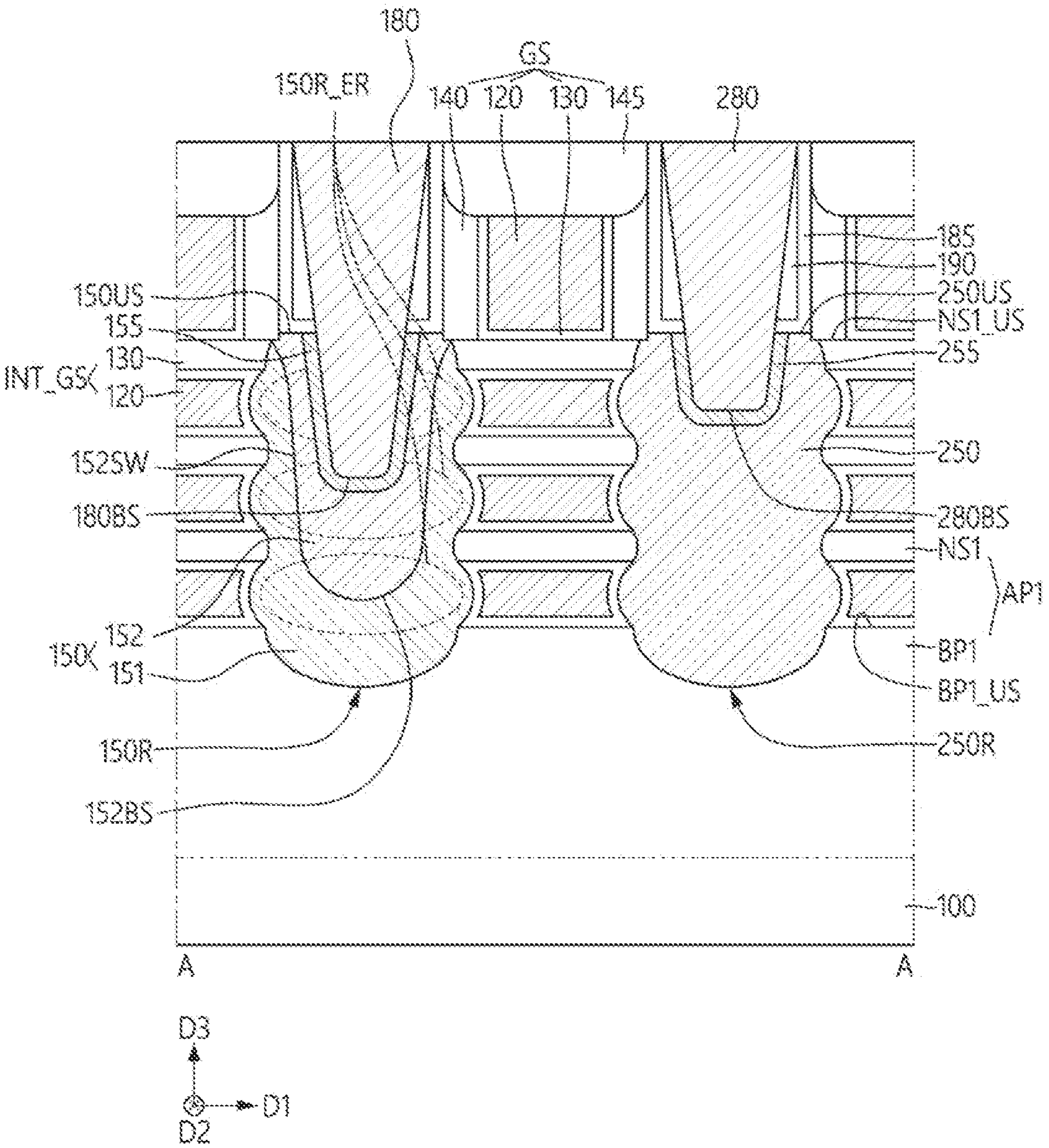
FIGS. 4, 5, 6, 7, 8, 9, 10 and 11 are diagrams illustrating a semiconductor device according to some embodiments of the present inventive concept.

Referring to FIG. 4, the heights of the first source/drain contact 180 and the second source/drain contact 280 may be different from each other.

The lower face 180BS of the first source/drain contact 180 and the lower face 280BS of the second source/drain contact 280 may be placed at different heights from each other on the basis of the upper face BP1_US of the first lower pattern BP1. For example, the lower face 180BS of the first source/drain contact 180 may be placed below the lower face 280BS of the second source/drain contact 280. The lower face 180BS of the first source/drain contact 180 may be placed inside the second layer 152 of the first source/drain pattern 150.

Figure 5:
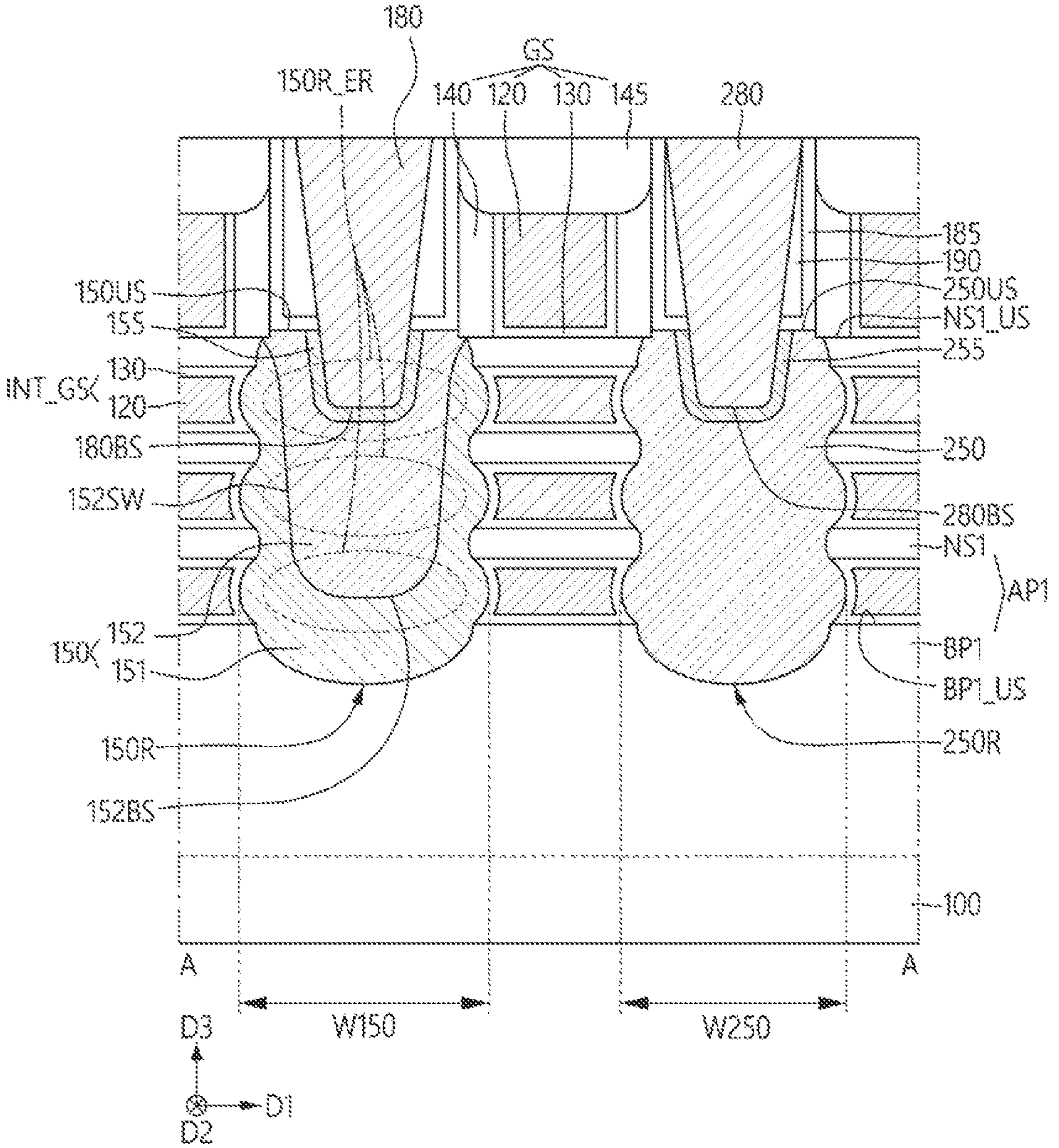

Referring to FIG. 5, the sizes of the first source/drain pattern 150 and the second source/drain pattern 250 may be different from each other. The sizes of the first source/drain recess 150R and the second source/drain recess 250R may be different from each other.

The first source/drain pattern 150 may have a first source/drain width W150. The second source/drain pattern 250 may have a second source/drain width W250. The first source/drain width W150 may be greater than the second source/drain width W250. For example, the size of the first source/drain pattern 150 may be greater than the size of the second source/drain pattern 250.

Figure 6:
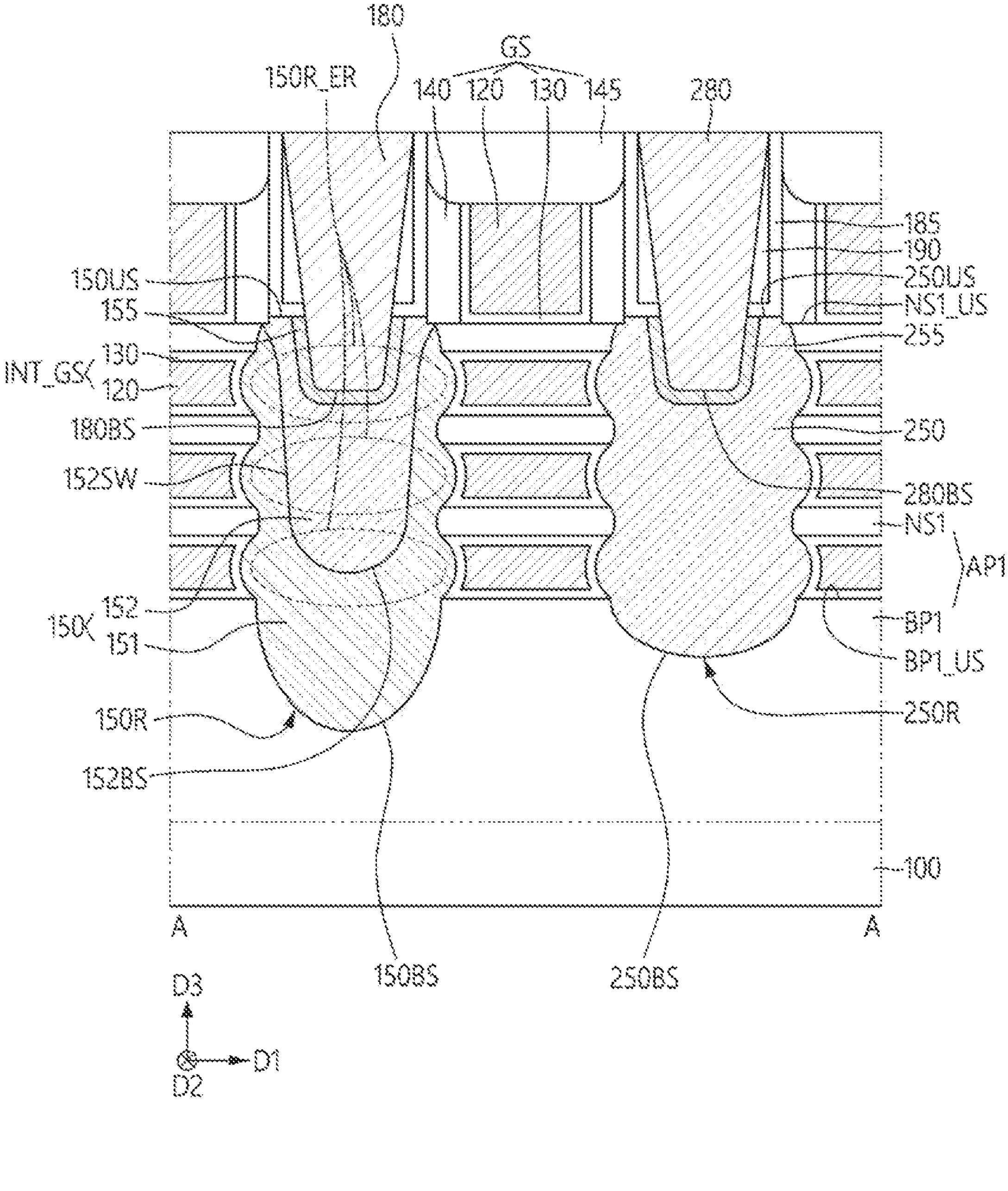

Referring to FIG. 6, the heights of the first source/drain patterns 150 and the second source/drain patterns 250 may be different from each other. The sizes of the first source/drain recess 150R and the second source/drain recess 250R may be different from each other.

For example, the height of the first source/drain pattern 150 may be greater than the height of the second source/drain pattern 250 in the third direction D3. The lower face 150BS of the first source/drain pattern 150 may be placed lower than the lower face 250BS of the second source/drain pattern 250 on the basis of the upper face BP1_US of the first lower pattern BP1.

Figure 7:
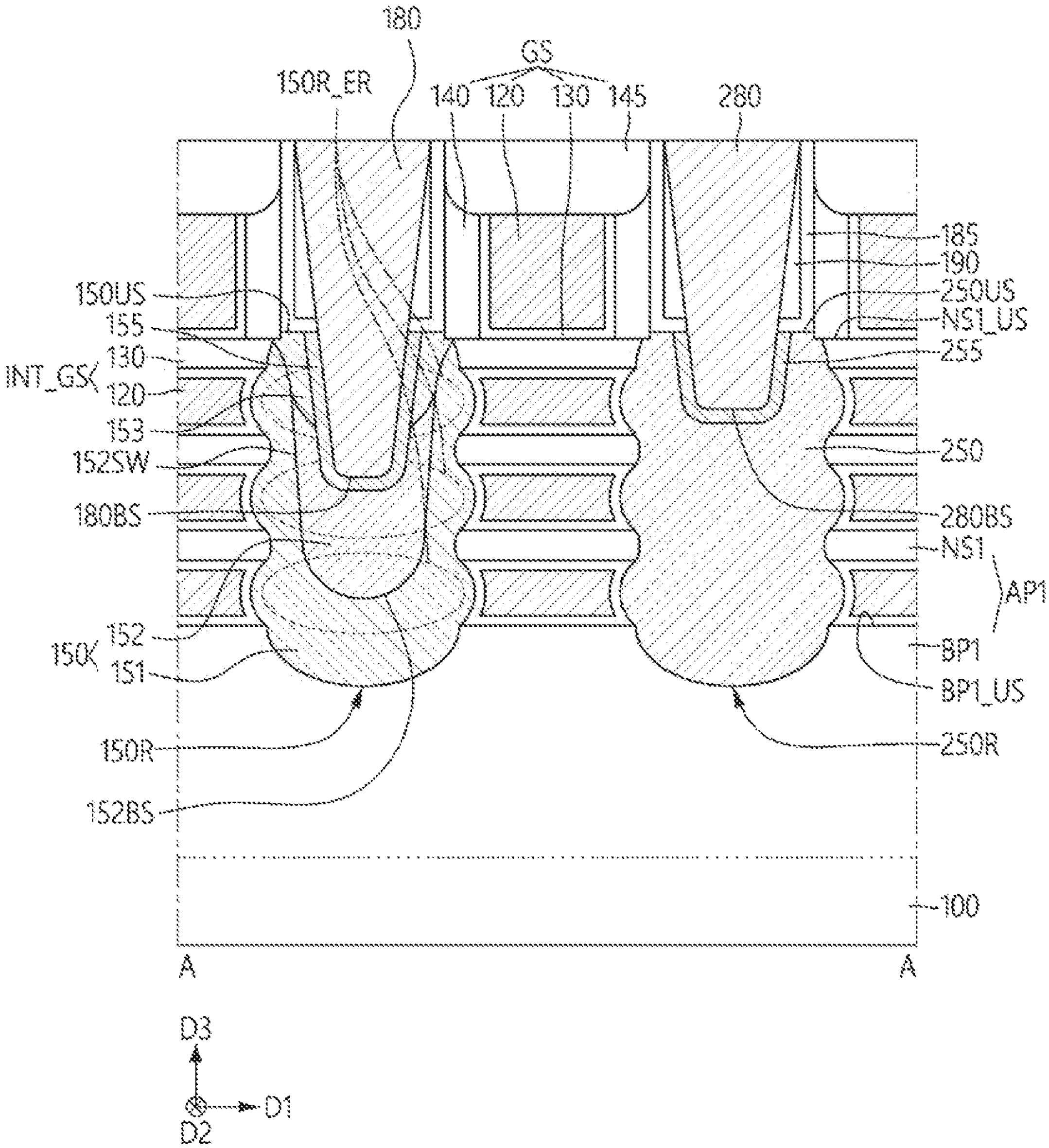

Referring to FIG. 7, the first source/drain pattern 150 may include first to third layers 151 to 153.

A third layer 153 may be placed on a second layer 152. For example, the third layer 153 may be a capping film. The third layer 153 may cover the upper face of the second layer 152. The second layer 152 may be placed between a first layer 151 and the third layer 153. For example, the third layer 153 may contact portions of the first layer 151. In an embodiment of the present inventive concept, the third layer 153 may extend beyond sides of the second layer 152.

A first source/drain contact 180 may penetrate the third layer 153. The first source/drain contact 180 may penetrate the third layer 153 and extend to the second layer 152. For example, the first source/drain contact 180 may completely penetrate the third layer 153 and may contact the second layer 152. The first source/drain contact 180 might not extend to the first layer 151. The first source/drain contact 180 might not be in contact with the first layer 151.

The lower face 180BS of the first source/drain contact 180 may be placed inside the second layer 152. The lower face 280BS of the second source/drain contact 180 may be placed inside the second source/drain pattern 250. The lower face 180BS of the first source/drain contact 180 and the lower face 280BS of the second source/drain contact 280 may have different heights from each other on the basis of the upper face BP1_US of the first lower pattern BP1.

Figure 8:
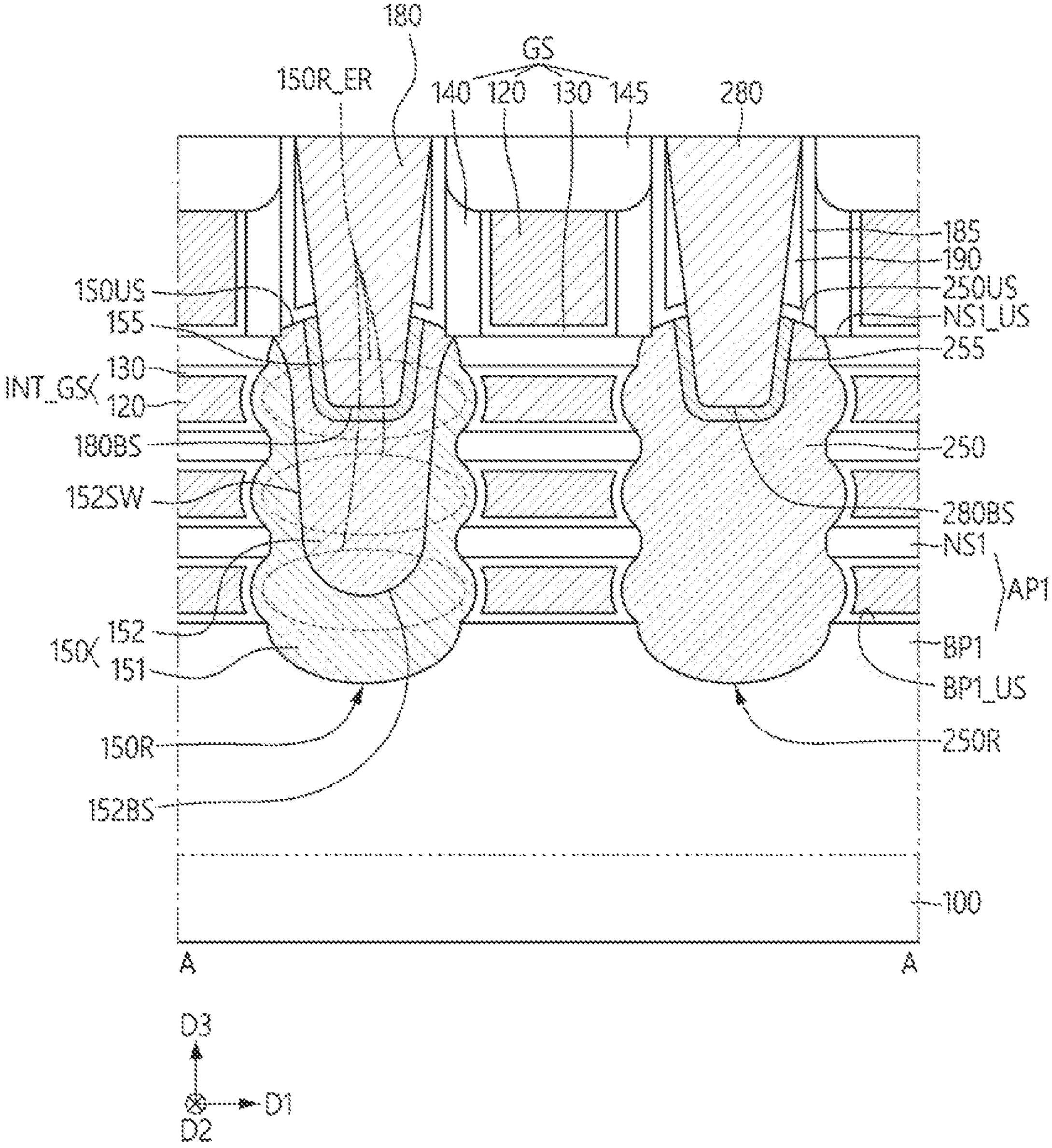

Referring to FIG. 8, the upper face 150US of the first source/drain pattern 150 and the upper face 250US of the second source/drain pattern 250 may be convex.

The upper face 150US of the first source/drain pattern 150 and the upper face 250US of the second source/drain pattern 250 may have a convex shape in a direction away from the first lower pattern BP1. The height of the upper face 150US of the first source/drain pattern 150 may increase toward a central part of the first source/drain pattern 150, and decrease toward an edge part of the first source/drain pattern 150. The height of the upper face 250US of the second source/drain pattern 250 may increase toward the central part of the second source/drain pattern 250, and decrease toward the edge part of the first source/drain pattern 150.

The source/drain etching stop film 185 may bend along the upper face 150US of the first source/drain pattern 150 and the upper face 250US of the second source/drain pattern 250. For example, the lower face of the source/drain etching stop film 185 may protrude upward in a direction away from the first lower pattern BP1.

Figure 9:
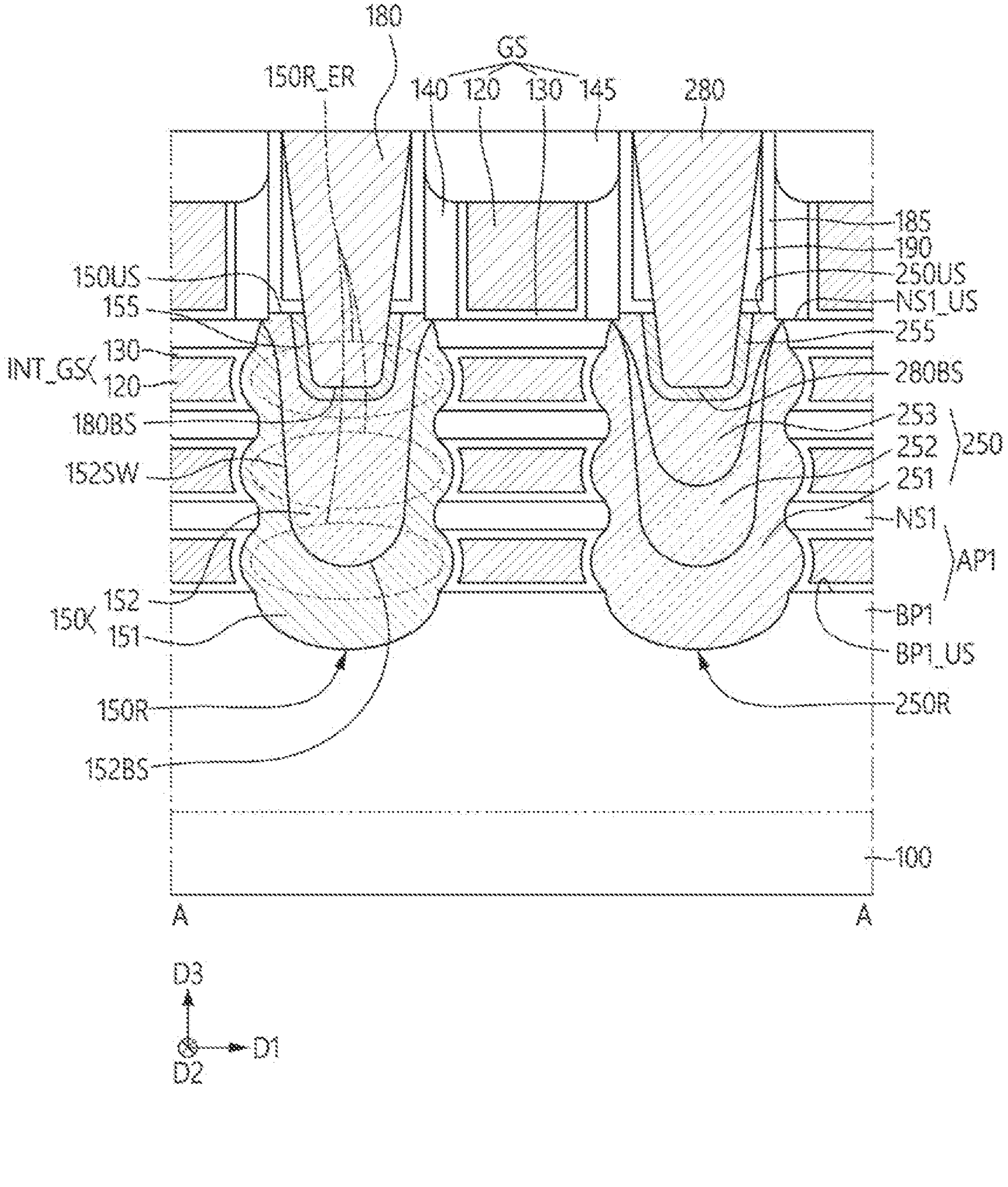

Referring to FIG. 9, the second source/drain pattern 250 may include first to third sub-films 251 to 253. A second sub-film 252 may be placed on a first sub-film 251. A third sub-film 253 may be placed on the second sub-film 252. All of the first to third sub-films 251 to 253 may be the same conductivity type as one another. For example, all of the first to third sub-films 251 to 253 may be an N-type. As another example, all of the first to third sub-films 251 to 253 may be a P-type.

A lower face 180BS of the first source/drain contact 180 may be placed inside the second layer 152 of the first source/drain pattern 150. However, the lower face 280BS of the second source/drain contact 280 may be placed anywhere inside the first to third sub-films 251 to 253. For example, the lower face 280BS of the second source/drain contact 280 may be placed inside the first sub-film 251. As another example, the lower face 280BS of the second source/drain contact 280 may be placed inside the third sub-film 253. As another example, the second source/drain contact 280 may contact the first to third sub-films 251 to 253.

Figure 10:
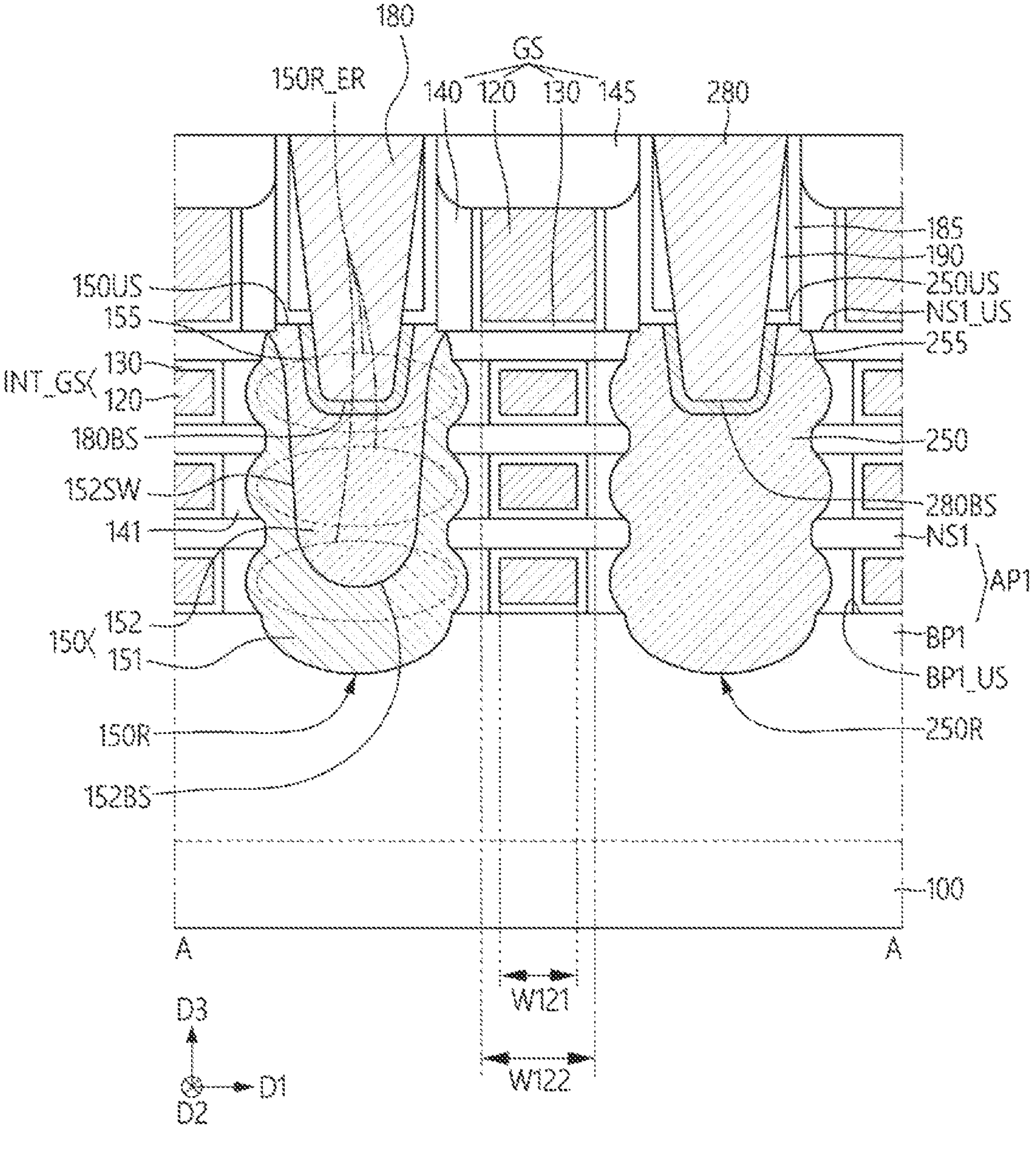

Referring to FIG. 10, an internal spacer 141 may be placed. The internal spacer 141 may be placed on the side face of the inner gate structure INT_GS. For example, the internal spacer 141 may contact the first gate insulating layer 130. The internal spacer 141 may be in contact with the first source/drain pattern 150 and the second source/drain pattern 250.

The internal spacer 141 may be placed between the inner gate structure INT_GS and the first source/drain pattern 150, and between the inner gate structure INT_GS and the second source/drain pattern 250 in the first direction D1.

The internal spacer 141 may include, for example, at least one of silicon nitride (SiN), silicon oxynitride (SiON), silicon oxide ($SiO_2$), oxycarbonitride (SiOCN), silicon boronitride (SiBN), silicon oxyboronitride (SiOBN), silicon oxycarbide (SiOC), and combinations thereof.

On the basis of the upper face BP1_US of the first lower pattern BP1, the gate electrode 120 may include an upper gate electrode placed above the first sheet pattern NS1 placed at the uppermost part of the first sheet patterns NS1, and a lower gate electrode placed below the first sheet pattern NS1 placed at the lowermost part of the first sheet patterns NS1. The lower gate electrode may have a first gate width W121. The upper gate electrode may have a second gate width W122. The first gate width W121 may be smaller than the second gate width W122. However, embodiments of the present inventive concept are not limited thereto. For example, the first gate width W121 and the second gate width W122 may be the same as each other. For example, the first gate width W121 may be greater than the second gate width W122.

Figure 11:
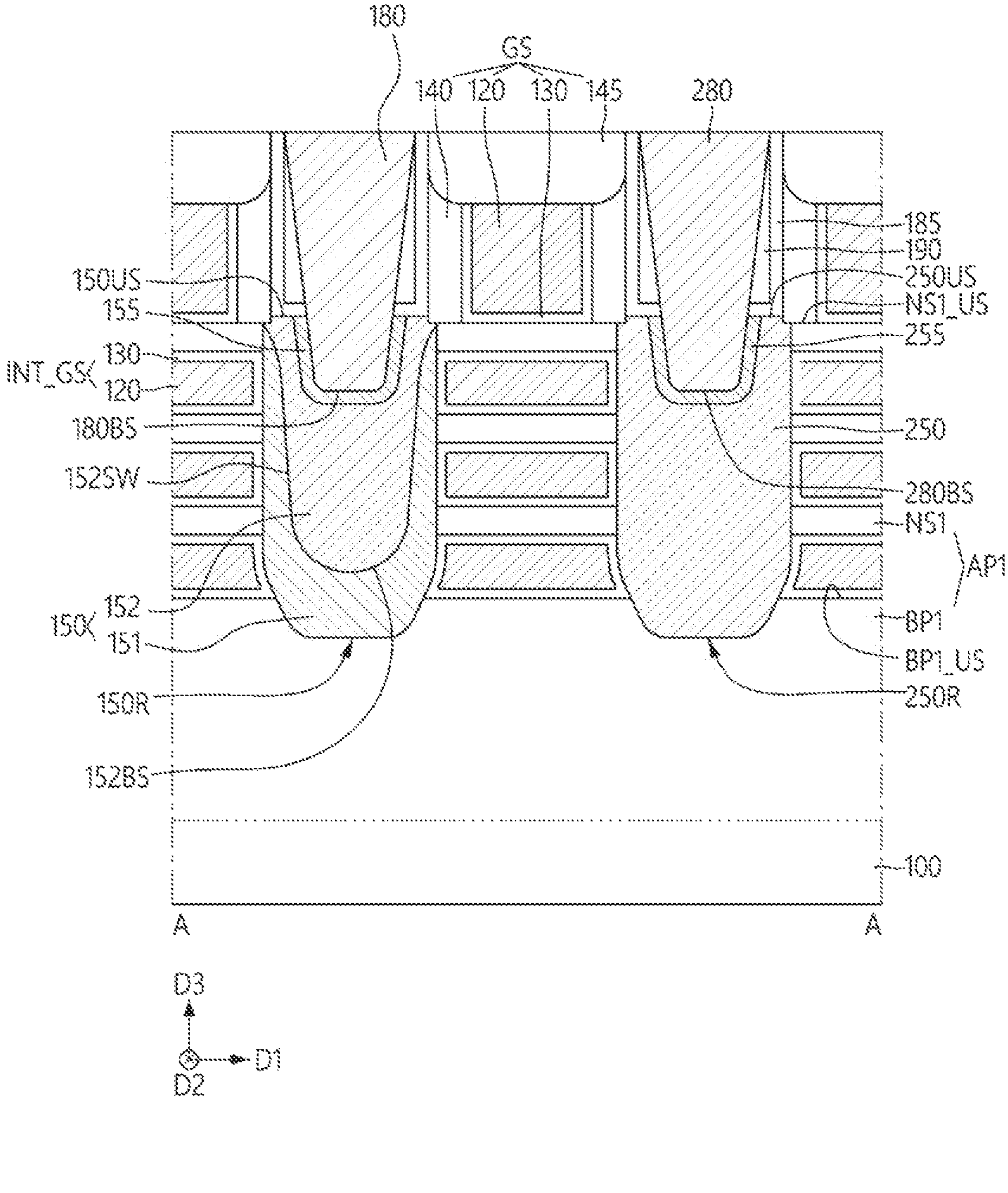

Referring to FIG. 11, the first source/drain pattern 150 and the second source/drain pattern 250 might not have side surfaces with a wavy shape. The side walls of the first source/drain pattern 150 may be flat. The side walls of the second source/drain pattern 250 may be flat.

FIGS. 12 to 23 are diagrams illustrating intermediate steps of a method for fabricating a semiconductor device according to some embodiments of the present inventive concept. For reference, FIGS. 12 to 23 illustrate the method for fabricating the semiconductor device shown in FIG. 10.

Figure 12:
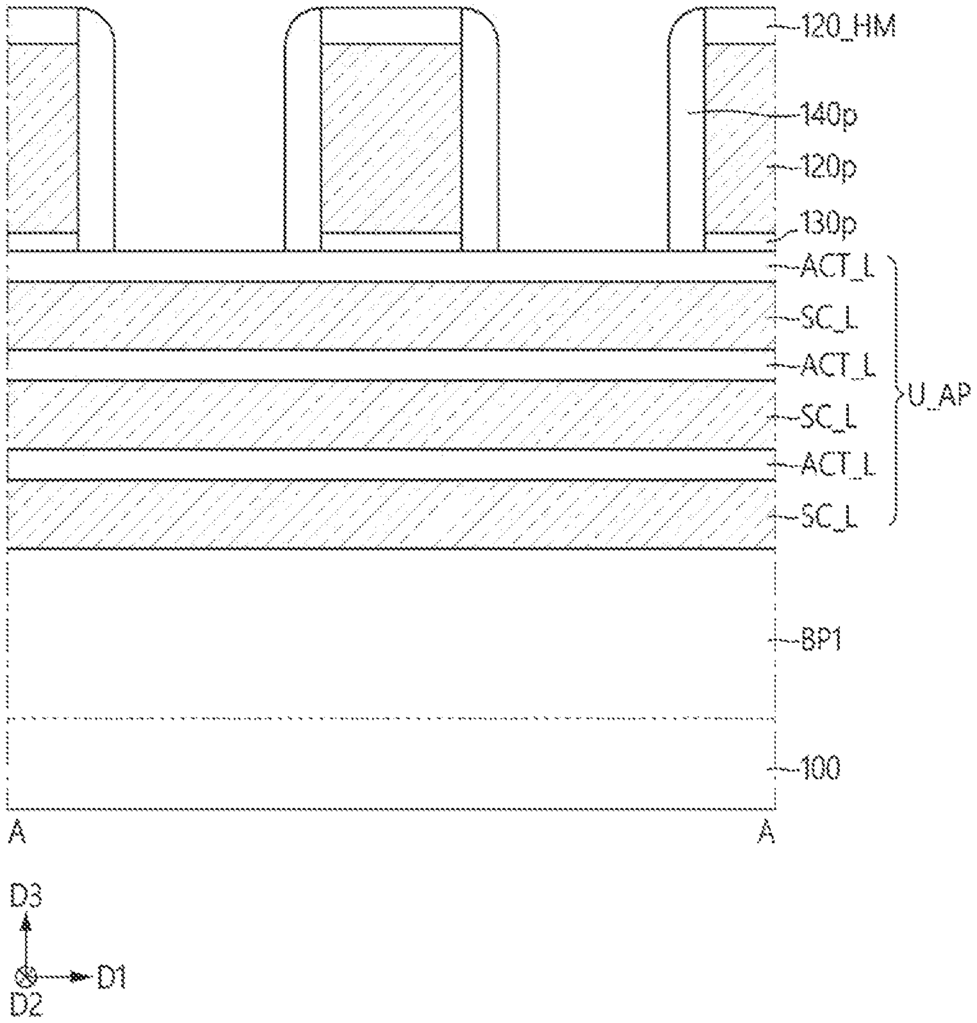
FIGS. 12, 13, 14, 15, 16, 17, 18, 19, 20, 21, 22 and 23 are diagrams illustrating intermediate steps of a method for fabricating a semiconductor device according to some embodiments of the present inventive concept.

Referring to FIG. 12, a first lower pattern BP1 and an upper pattern structure U_AP may be formed on the substrate 100.

The upper pattern structure U_AP may be placed on the first lower pattern BP1. The upper pattern structure U_AP may include a plurality of sacrificial patterns SC_L and a plurality of active patterns ACT_L which are alternately stacked on the first lower pattern BP1.

For example, the sacrificial pattern SC_L may include a silicon-germanium film. For example, the active pattern ACT_L may include a silicon film.

Subsequently, a dummy gate insulating film 130*p*, a dummy gate electrode 120*p*, and a dummy gate capping film 120_HM may be formed on the upper pattern structure U_AP. The dummy gate insulating film 130*p* may include, for example but is not limited to, silicon oxide. The dummy gate electrode 120*p* may include, for example, but is not limited to, polysilicon. The dummy gate capping film 120_HM may include, for example, but is not limited to, silicon nitride.

A pre-gate spacer 140*p* may be formed on side walls of the first dummy gate electrode 120*p*.

Figure 13:
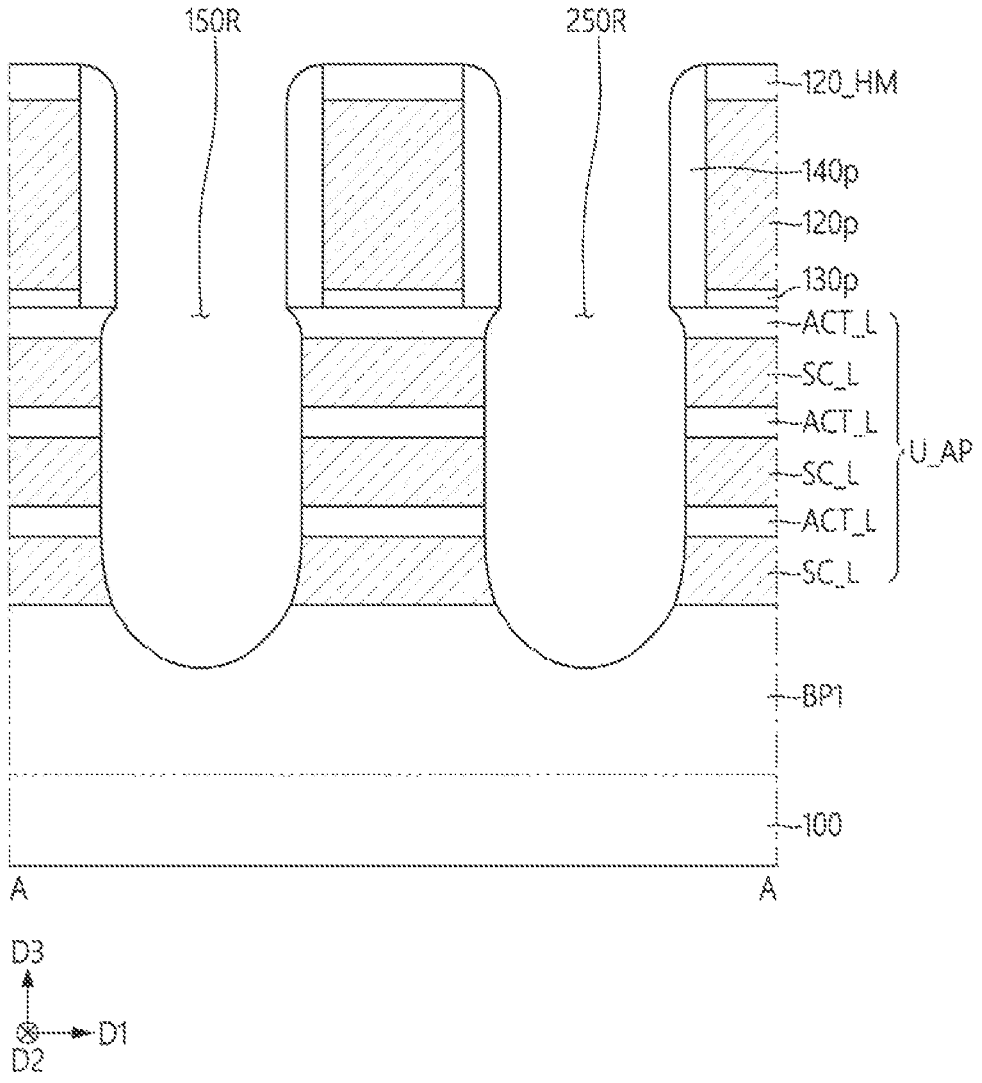
Figure 14:
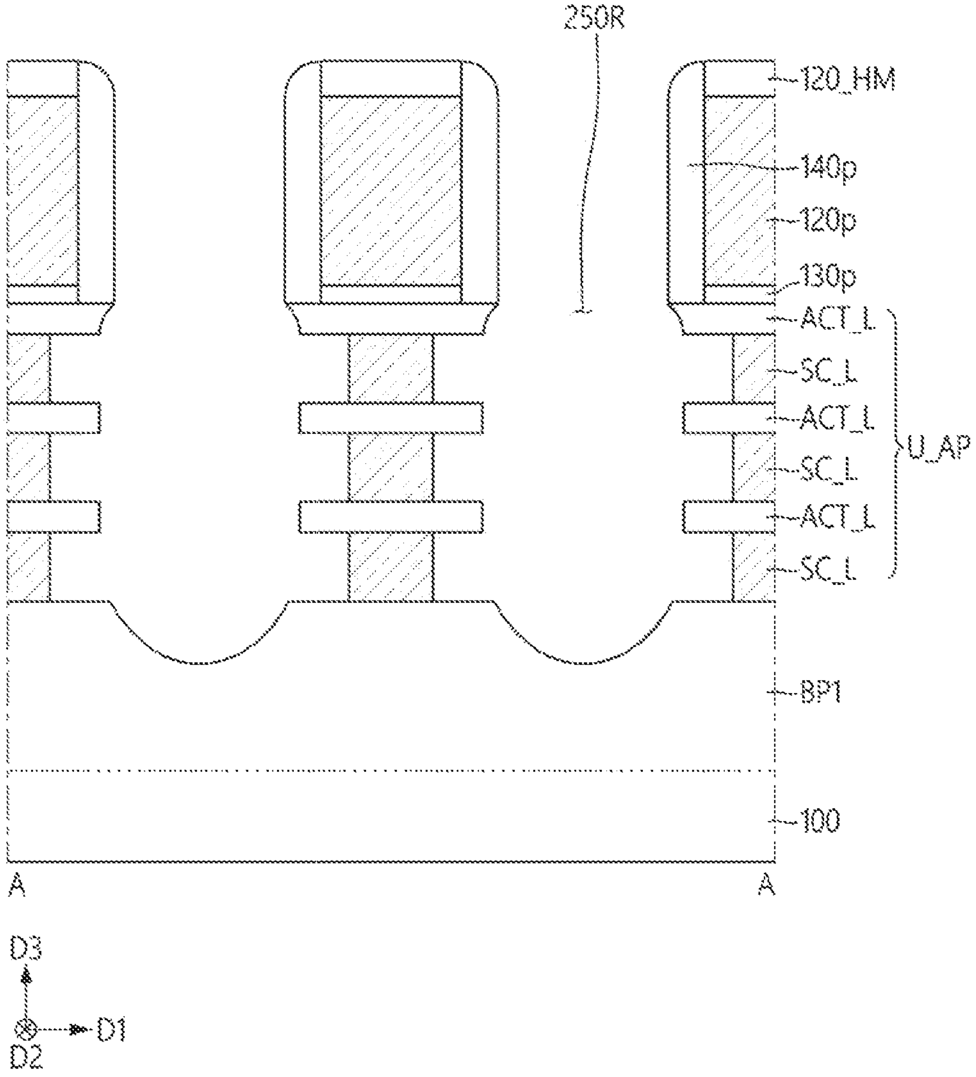

Referring to FIGS. 13 and 14, a first source/drain recess 150R and a second source/drain recess 250R may be formed inside the upper pattern structure U_AP, using the dummy gate electrode 120*p* as a mask.

A part of the first source/drain recess 150R may be formed inside the first lower pattern BP1. A bottom face of the first source/drain recess 150R may be defined by the first lower pattern BP1.

In FIG. 13, the width of the first source/drain recess 150R in the first direction D1 may increase and decrease as it goes away from the first lower pattern BP1.

In FIG. 14, the first source/drain recess 150R and the second source/drain recess 250R may include a plurality of width extension regions 150R_ER. For example, after forming the first source/drain recess 150R and the second source/drain recess 250R as shown in FIG. 13, the sacrificial pattern SC_L is additionally etched, and the width extension region 150R_ER of the first source/drain recess and the width extension region of the second source/drain recess 250R may be formed. Accordingly, the side walls of each of the first source/drain recess 150R and the second source/drain recess 250R may have steps without being continuous. However, the method for fabricating the first source/drain recess 150R including the plurality of width extension regions 150R_ER is not limited to the aforementioned one.

Figure 15:
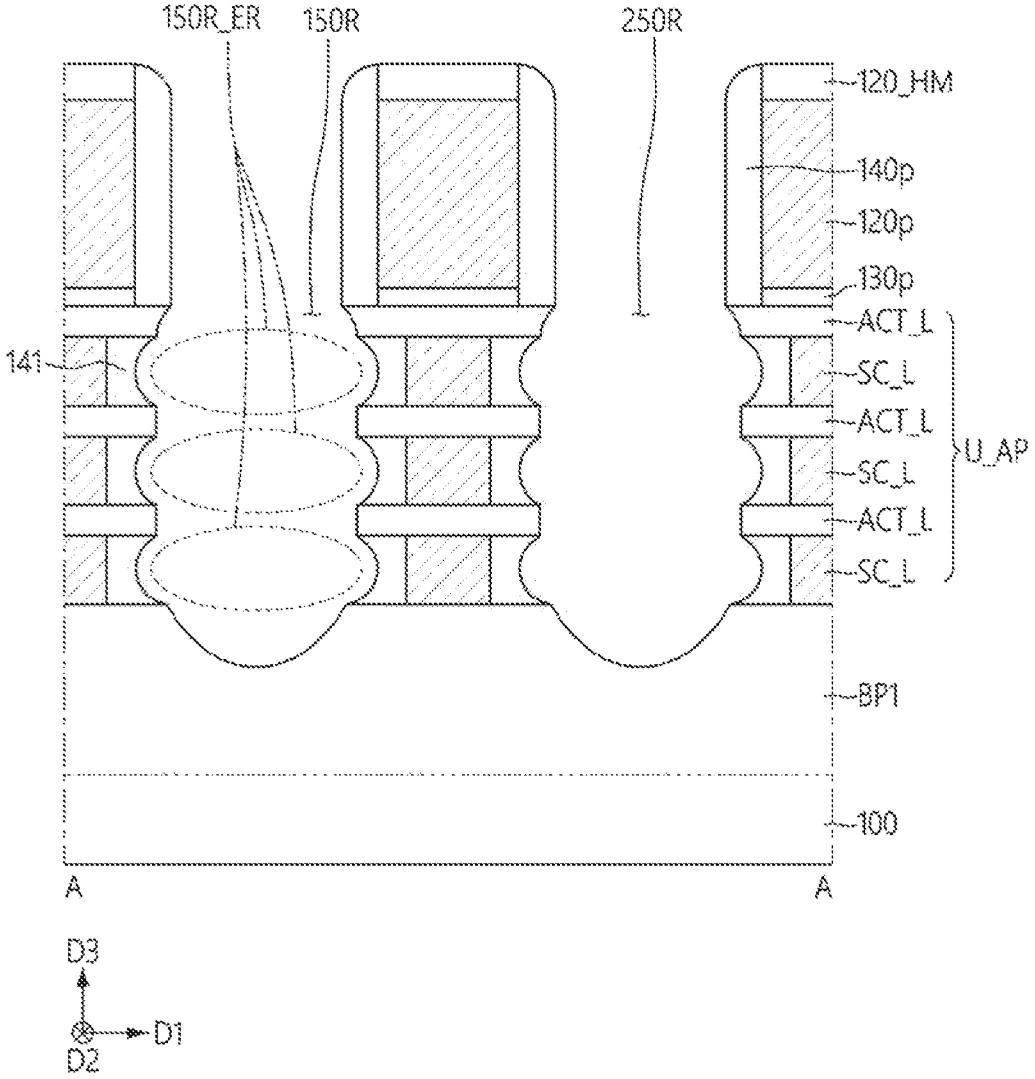

Referring to FIG. 15, an internal spacer 141 may be formed.

The internal spacer 141 may be placed on the side face of the sacrificial pattern SC_L inside the first source/drain recess 150R and the second source/drain recess 250R. A plurality of width extension regions 150R_ER of the first source/drain recesses 150R and the second source/drain recesses 250R may be formed between the internal spacers 141.

Figure 16:
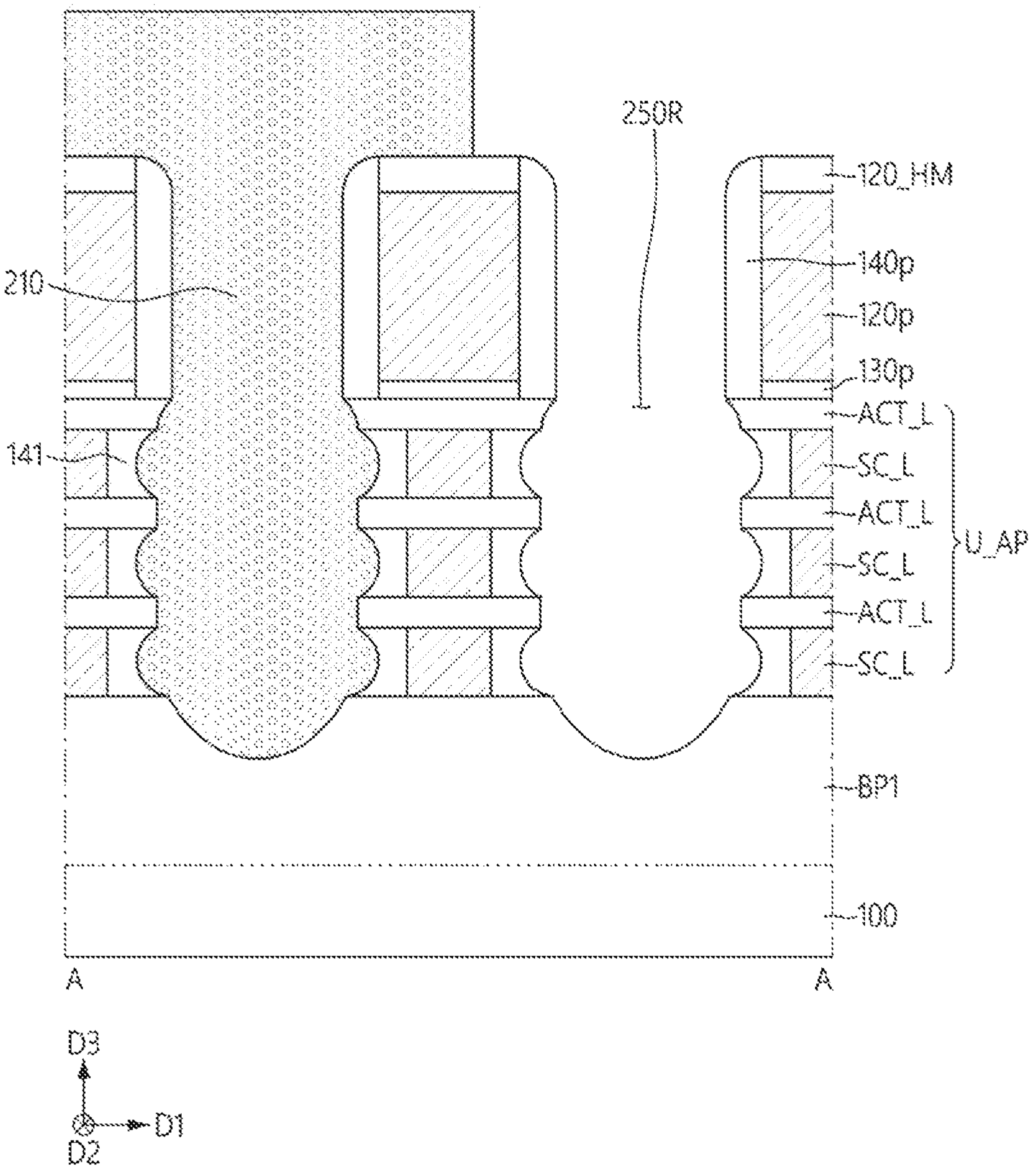

Referring to FIG. 16, a first mask 210 is formed on the first source/drain recess 150R.

The first mask 210 may fill the first source/drain recess 150R. The first mask 210 may overlap some parts of the dummy gate electrode 120*p* and the dummy gate capping film 120_HM that are placed to be adjacent to the first source/drain recess 150R. The first mask 210 may cover some parts of the dummy gate electrode 120*p* and the dummy gate capping film 120_HM that are placed to be adjacent to the first source/drain recess 150R.

The first mask 210 may be in contact with the internal spacer 141 inside the first source/drain recess 150R.

Figure 17:
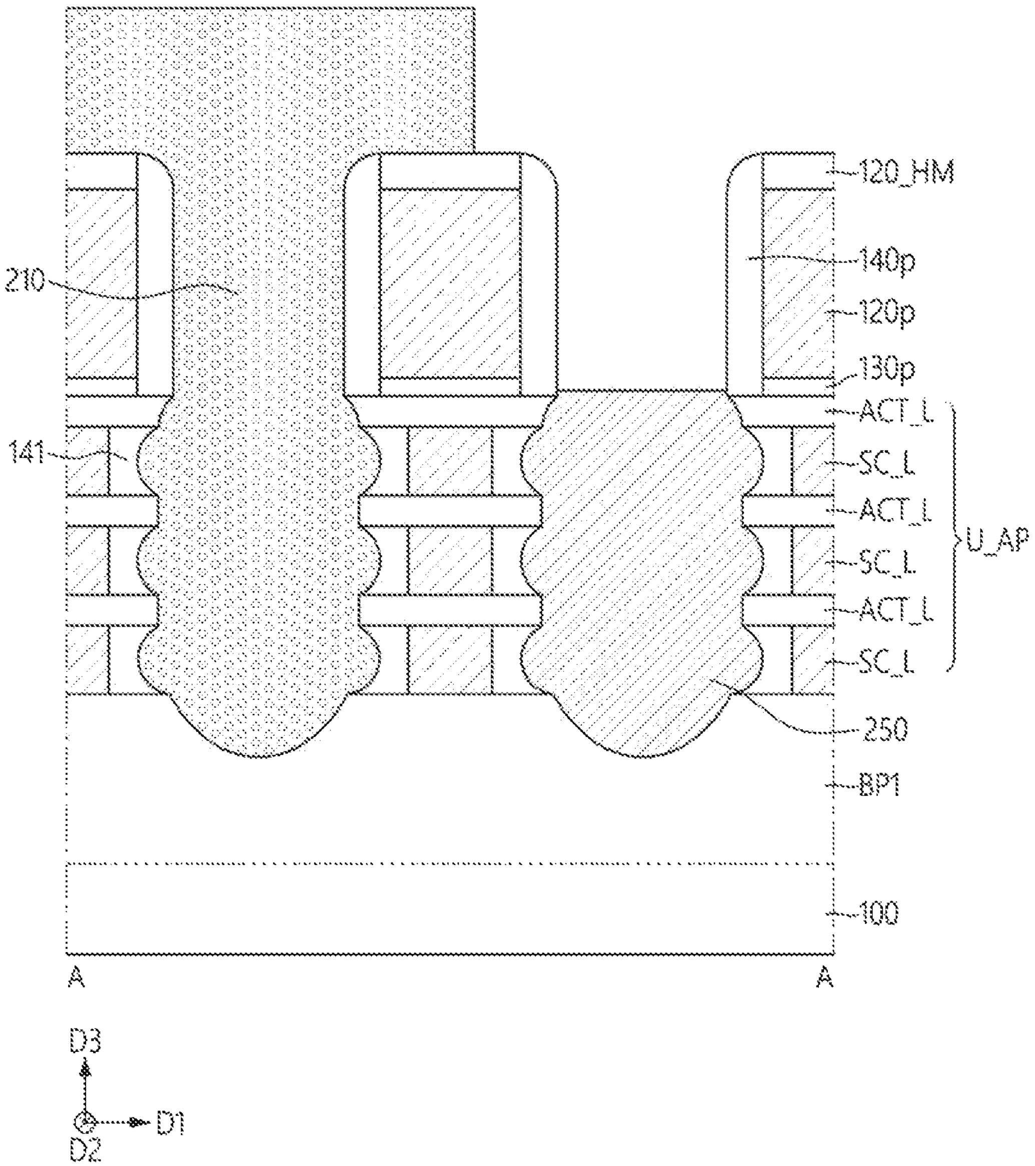

Referring to FIG. 17, a second source/drain pattern 250 is formed.

The second source/drain pattern 250 may be formed inside the second source/drain recess 250R. The second source/drain pattern 250 may fill the second source/drain recess 250R. The upper face of the second source/drain pattern 250 may protrude above the upper face of the active pattern ACT_L placed at the uppermost part of the active patterns ACT_L. The second source/drain pattern 250 is connected to the active pattern ACT_L. The second source/drain pattern 250 may be in contact with the internal spacer 141.

Figure 18:
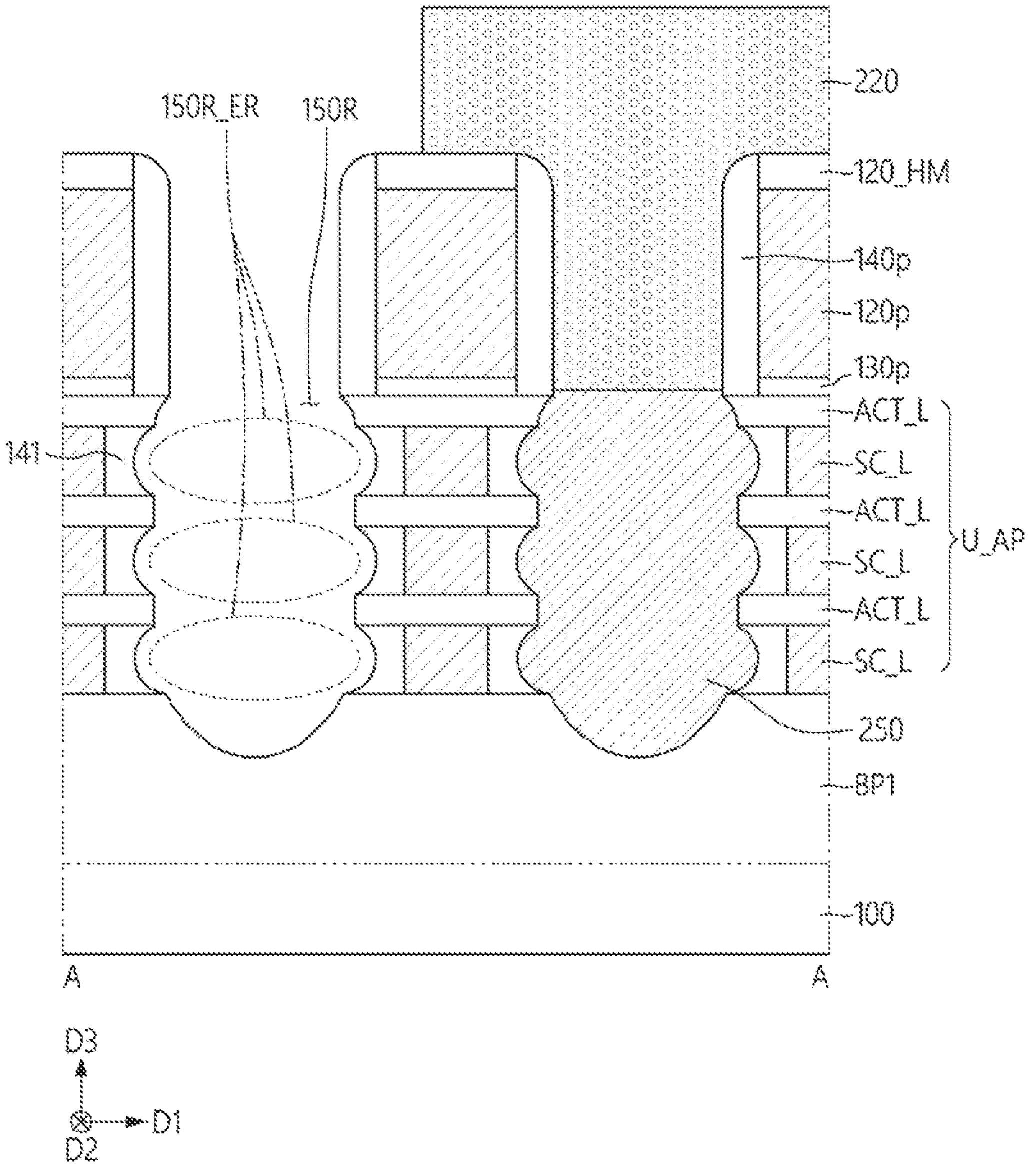

Referring to FIG. 18, the first mask 210 is removed, and a second mask 220 is formed.

The first mask 210 is removed, and the first source/drain recess 150R may be exposed.

The second mask 220 may be formed on the second source/drain pattern 250. The second mask 220 may cover the second source/drain pattern 250. The second mask 220 may partially overlap the dummy gate electrode 120*p* and the dummy gate capping film 120_HM that are placed to be adjacent to the second source/drain pattern 250. The second mask 220 may cover some parts of the dummy gate electrode 120*p* and the dummy gate capping film 120_HM that are placed to be adjacent to the second source/drain pattern 250.

Figure 19:
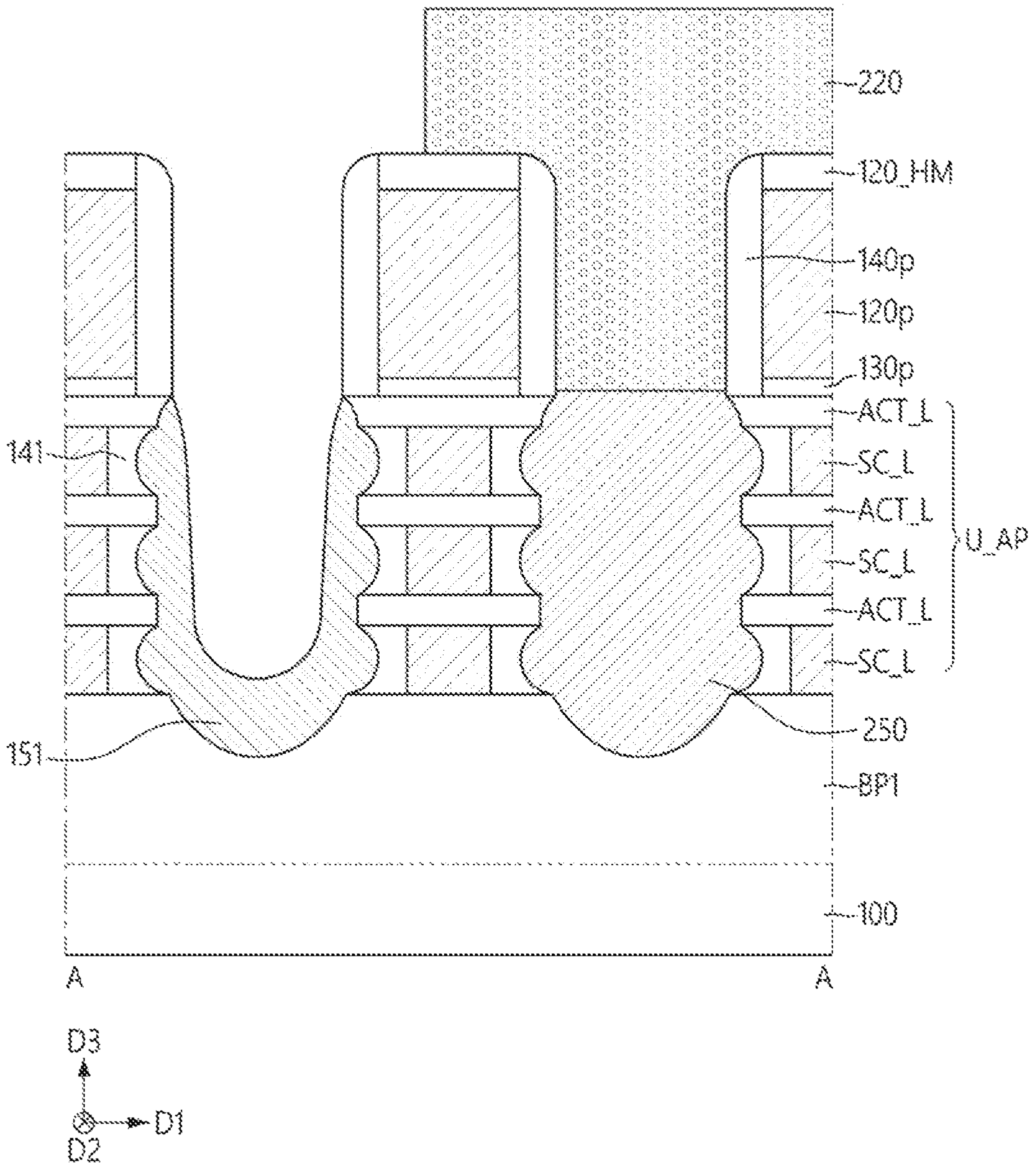

Referring to FIG. 19, a first layer 151 is formed.

The first layer 151 may be formed inside the first source/drain recess 150R. The first layer 151 may extend along the profile of the first source/drain recess 150R. The first layer 151 may be formed along the bottom face and inner side faces of the first source/drain recess 150R. The first layer 151 is connected to the active pattern ACT_L. The first layer 151 may be in contact with the internal spacer 141.

The first layer 151 may include a material of a different conductivity type from that of the second source/drain pattern 250. For example, if the second source/drain pattern 250 is an N-type, the first layer 151 may be a P-type. As another example, if the second source/drain pattern 250 is a P-type, the first layer 151 may be an N-type.

Figure 20:
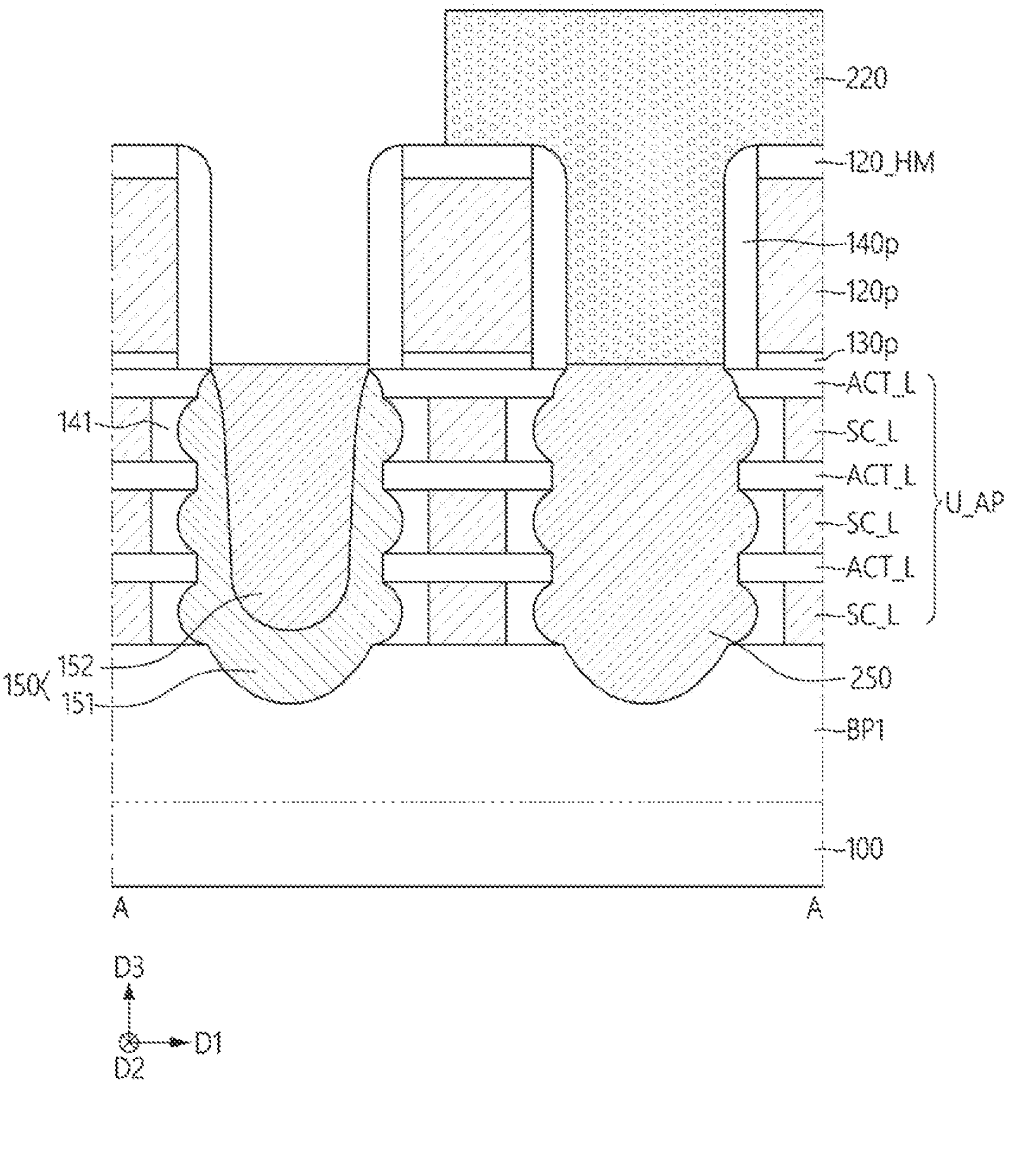

Referring to FIG. 20, a second layer 152 is formed.

The second layer 152 may be formed on the first layer 151. The second layer 152 may cover the first layer 151. The second layer 152 may fill the first source/drain recess 150R. For example, the second layer 152 may fill remaining space of the first source/drain recess 150R that is not filled with the first layer 151. The upper face of the second layer 152 may protrude above the upper face of the active pattern ACT_L placed at the uppermost part of the active patterns ACT_L.

The second layer 152 may include a material of conductivity type different from that of the first layer 151. The second layer 152 may include the material of the same conductivity type as that of the second source/drain pattern 250. For example, if the first layer 151 is a P-type and the second source/drain pattern 250 is an N-type, the second layer 152 may be an N-type. As another example, if the first layer 151 is an N-type and the second source/drain pattern 250 is a P-type, the second layer 152 may be a P-type.

Figure 21:
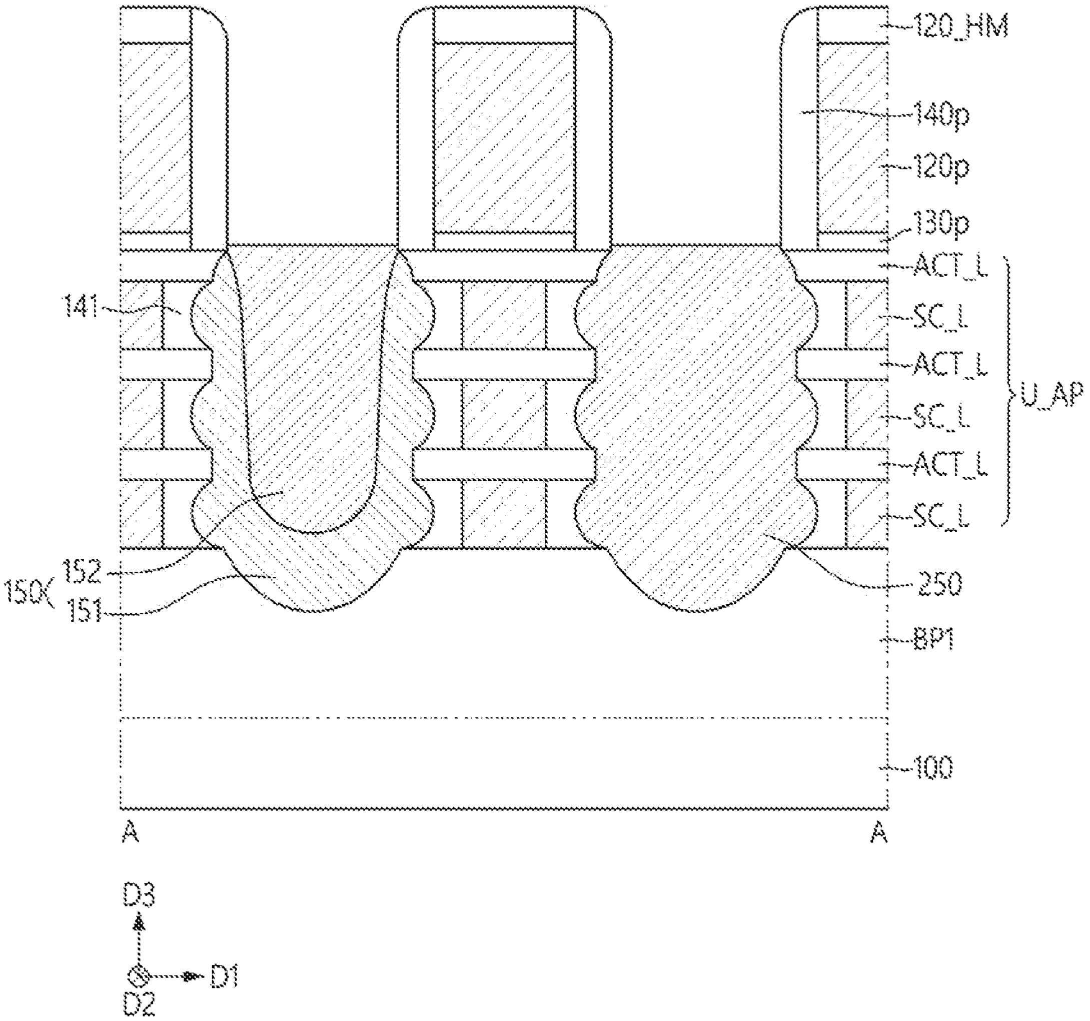

Referring to FIG. 21, the second mask 220 is removed.

The second mask 220 may be removed to expose the second source/drain pattern 250.

Figure 22:
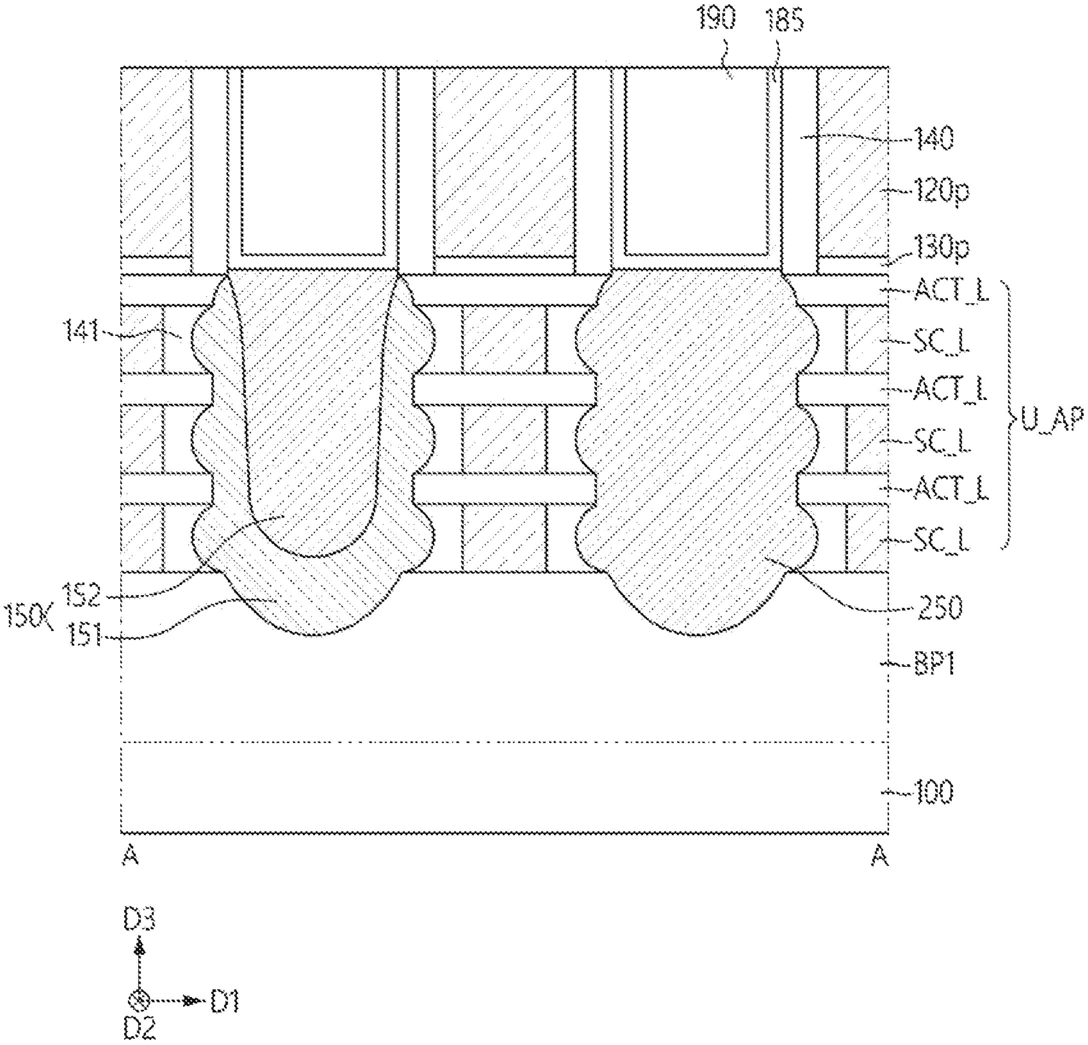

Referring to FIG. 22, a source/drain etching stop film 185 and an interlayer insulating film 190 are sequentially formed on the first source/drain pattern 150 and the second source/drain pattern 250.

Subsequently, a part of the interlayer insulating film 190, a part of the source/drain etching stop film 185, and the dummy gate capping film 120_HM are removed to expose the upper face of the dummy gate electrode 120*p*. A first gate spacer 140 may be formed, while the upper face of the dummy gate electrode 120*p* being is exposed.

Figure 23:
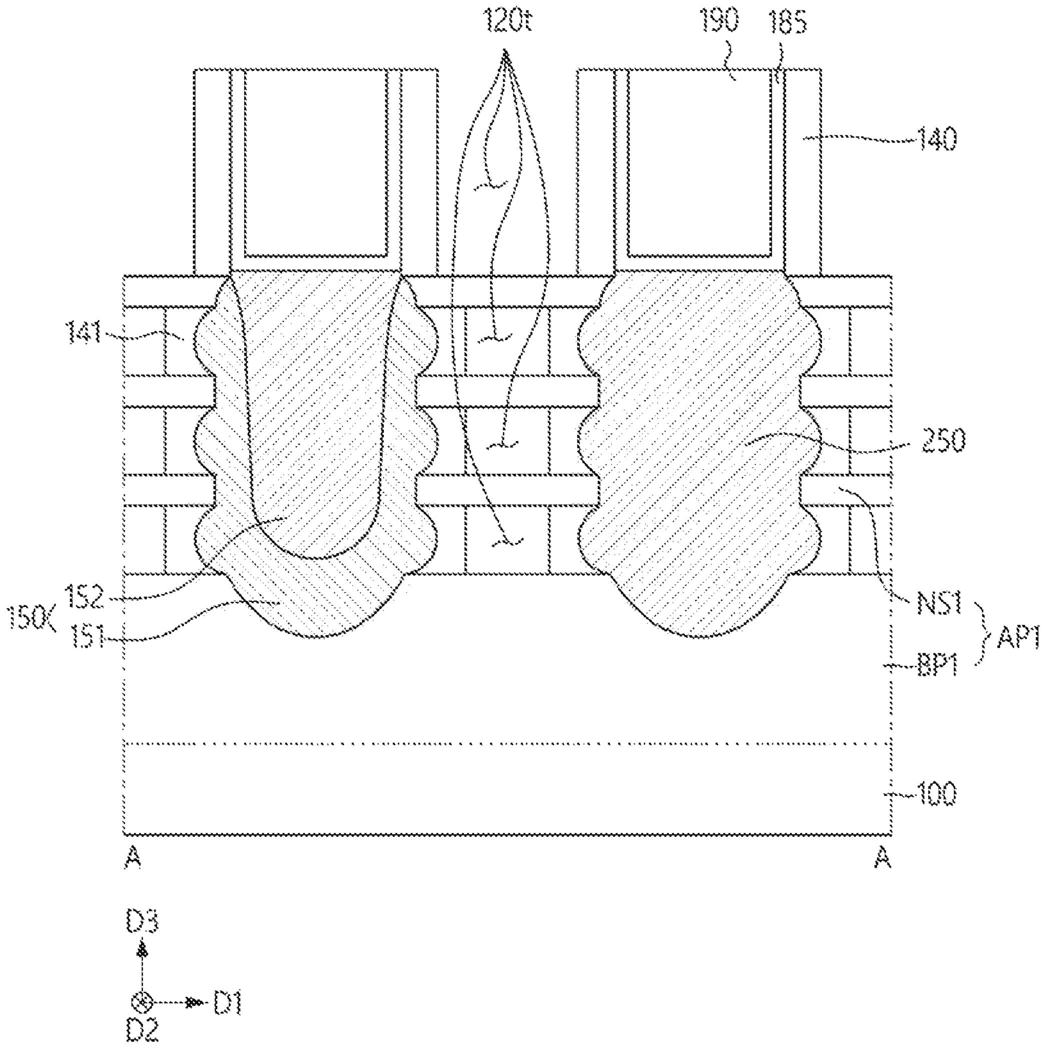

Referring to FIG. 23, the dummy gate insulating film 130*p* and the dummy gate electrode 120*p* may be removed to expose the upper pattern structure (U_AP of FIG. 22) between the first gate spacers 140.

After that, the sacrificial pattern (SC_L of FIG. 22) may be removed to form the first sheet pattern NS1. The first sheet pattern NS1 is connected to the first source/drain pattern 150 and the second source/drain pattern 250. The first sheet pattern NS1 comes into contact with the first layer 151 of the first source/drain pattern 150. As a result, the first active pattern AP1 including the first lower pattern BP1 and the first sheet pattern NS1 is formed.

In addition, the sacrificial pattern SC_L is removed to form the gate trench 120*t* between the internal spacer 141.

Next, referring to FIG. 10, a first gate insulating film 130 and a first gate electrode 120 may be formed inside the gate trench 120*t*. In addition, the first gate capping pattern 145 may be formed on the first gate insulating film 130 and the first gate electrode 120.

FIGS. 24 to 32 are diagrams illustrating intermediate steps of a method for fabricating the semiconductor device according to some embodiments of the present inventive concept. For reference, FIGS. 24 to 32 show the method for fabricating the semiconductor device shown in FIG. 5. For convenience of explanation, the explanation will focus on points that are different from those explained with reference to FIGS. 12 to 23.

Figure 24:
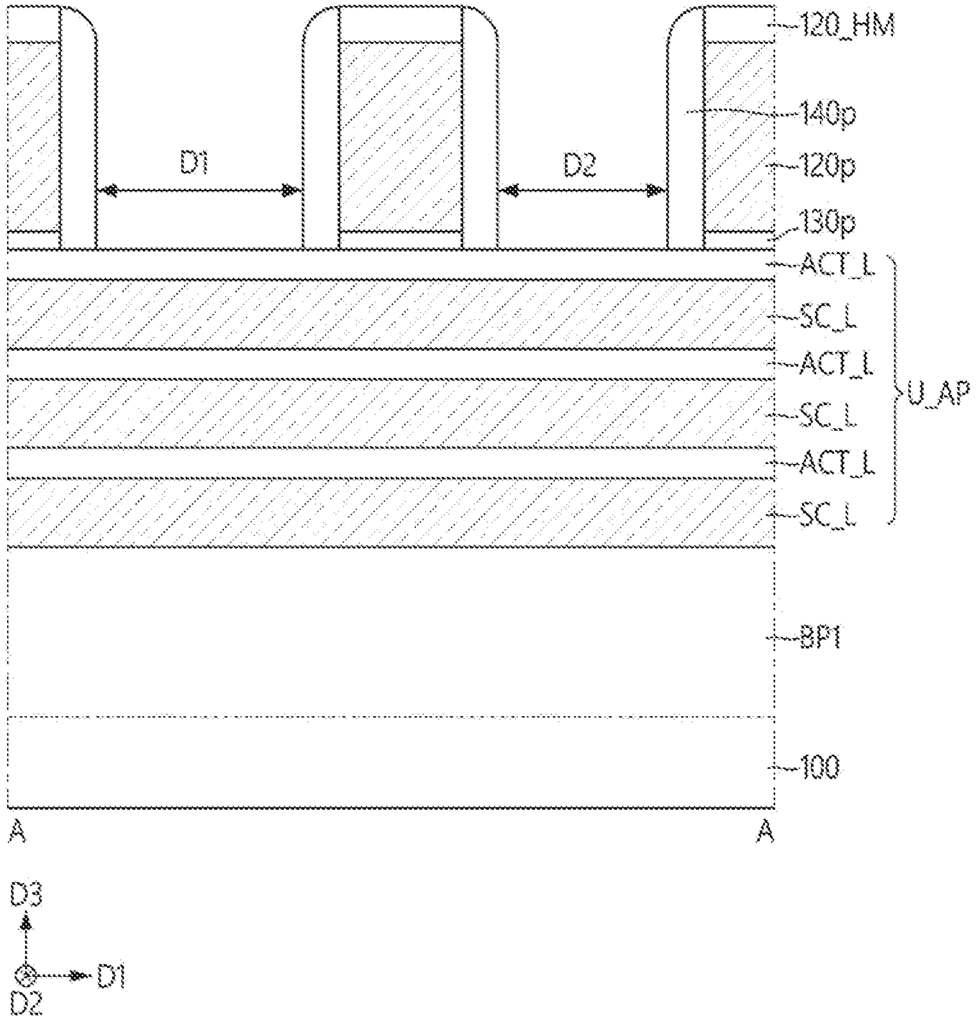
FIGS. 24, 25, 26, 27, 28, 29, 30, 31 and 32 are diagrams illustrating intermediate steps of a method for fabricating a semiconductor device according to some embodiments of the present inventive concept.

Referring to FIG. 24, the first lower pattern BP1 and the upper pattern structure U_AP may be formed on the substrate 100. The dummy gate insulating film 130*p*, the dummy gate electrode 120*p*, and the dummy gate capping film 120_HM may be formed on the upper pattern structure U_AP.

The dummy gate structures, each of which includes the pre-gate spacer 140*p*, the dummy gate insulating film 130*p*, the dummy gate electrode 120*p*, and the dummy gate capping film 120_HM, may be spaced apart from each other at varying intervals. For example, two dummy gate structures may be spaced apart at a first interval D1. Additionally, two other dummy gate structures may be spaced apart at a second interval D2. The first interval D1 and the second interval D2 are different from each other. For example, the first interval D1 may be greater than the second interval D2.

Figure 25:
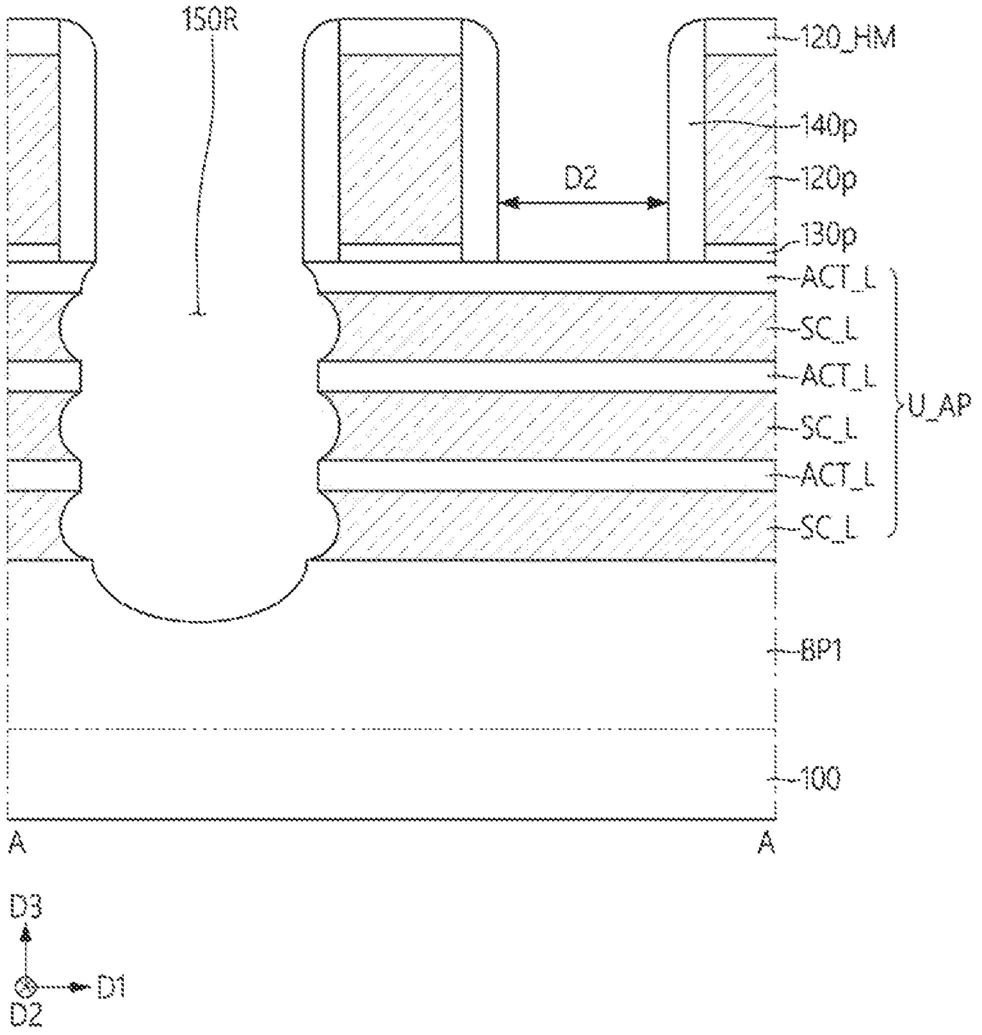

Referring to FIG. 25, a first source/drain recess 150R is formed.

The first source/drain recess 150R may be formed, using the dummy gate electrodes 120*p* that are spaced apart from each other at the first interval D1 as a mask. No recess is formed between the dummy gate electrodes 120*p* spaced apart from each other at the second interval D2.

Figure 26:
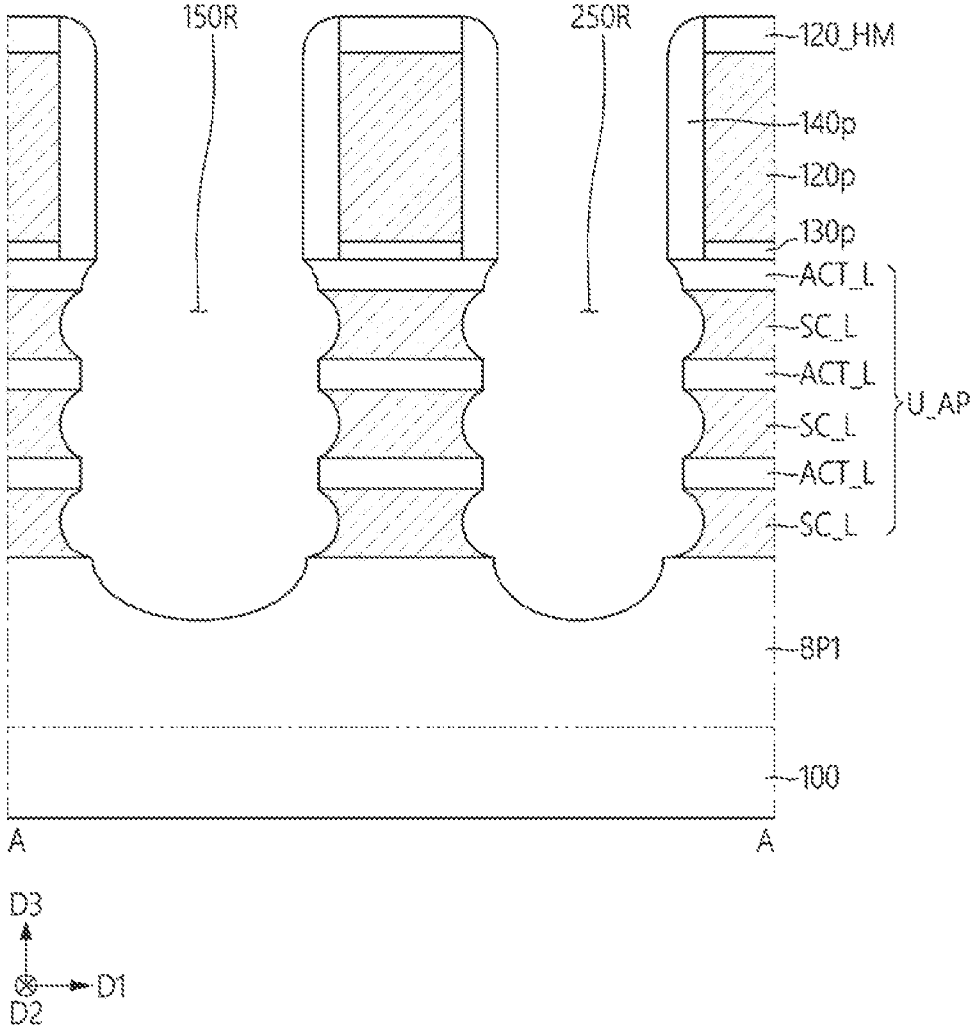

Referring to FIG. 26, the second source/drain recess 250R is formed.

The first source/drain recess 250R may be formed, using the dummy gate electrodes 120*p* that are spaced apart from each other at the second interval D2 as a mask.

Figure 27:
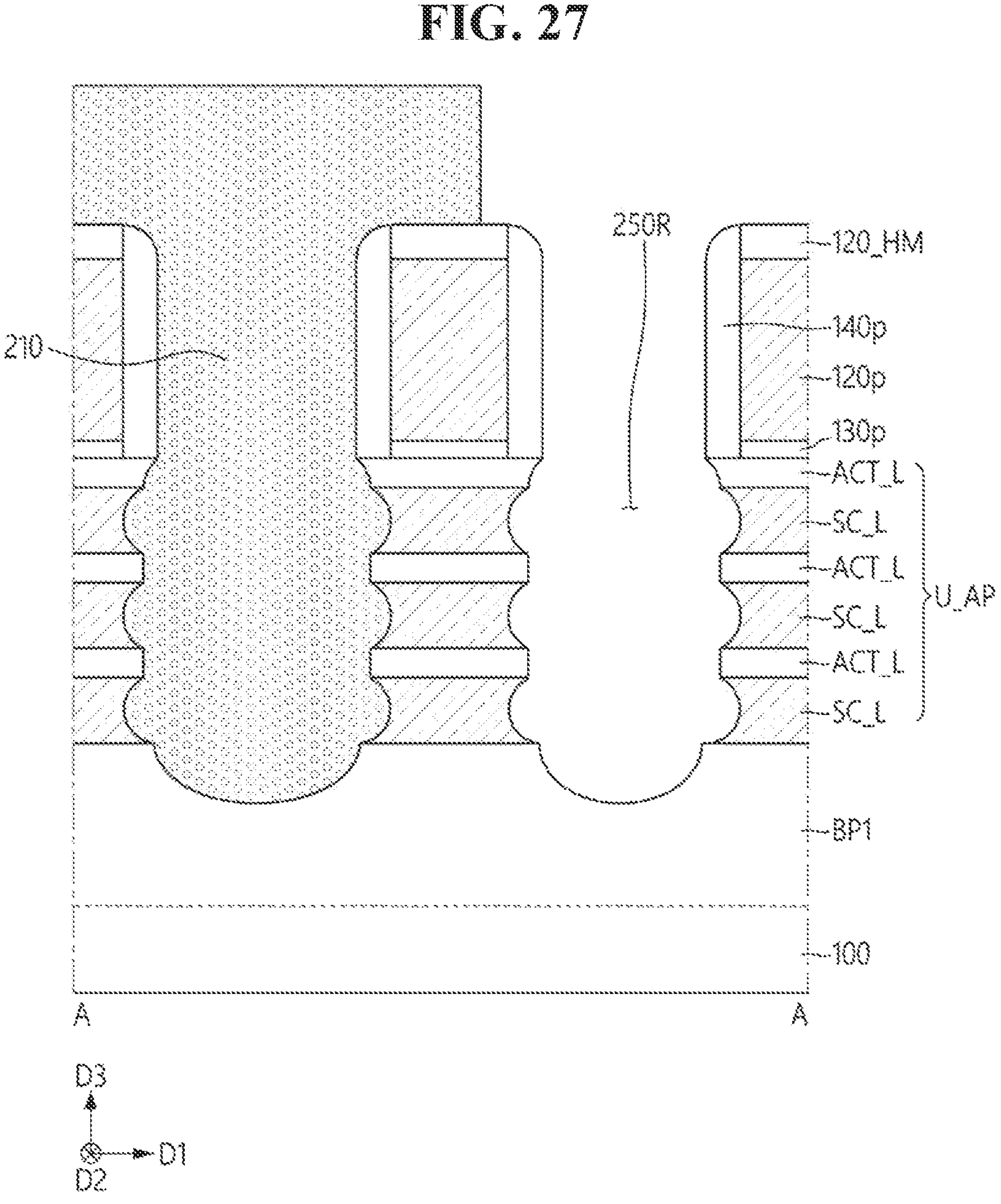

Referring to FIG. 27, the first mask 210 is formed on the first source/drain recess 150R.

The first mask 210 may fill the first source/drain recess 150R. The first mask 210 may overlap some parts of the dummy gate electrode 120*p* and the dummy gate capping film 120_HM that are placed to be adjacent to the first source/drain recess 150R. The first mask 210 may cover some parts of the dummy gate electrode 120*p* and the dummy gate capping film 120_HM that are placed to be adjacent to the first source/drain recess 150R.

The first mask 210 may be in contact with the sacrificial pattern SC_L and the active pattern ACT_L inside the first source/drain recess 150R.

Figure 28:
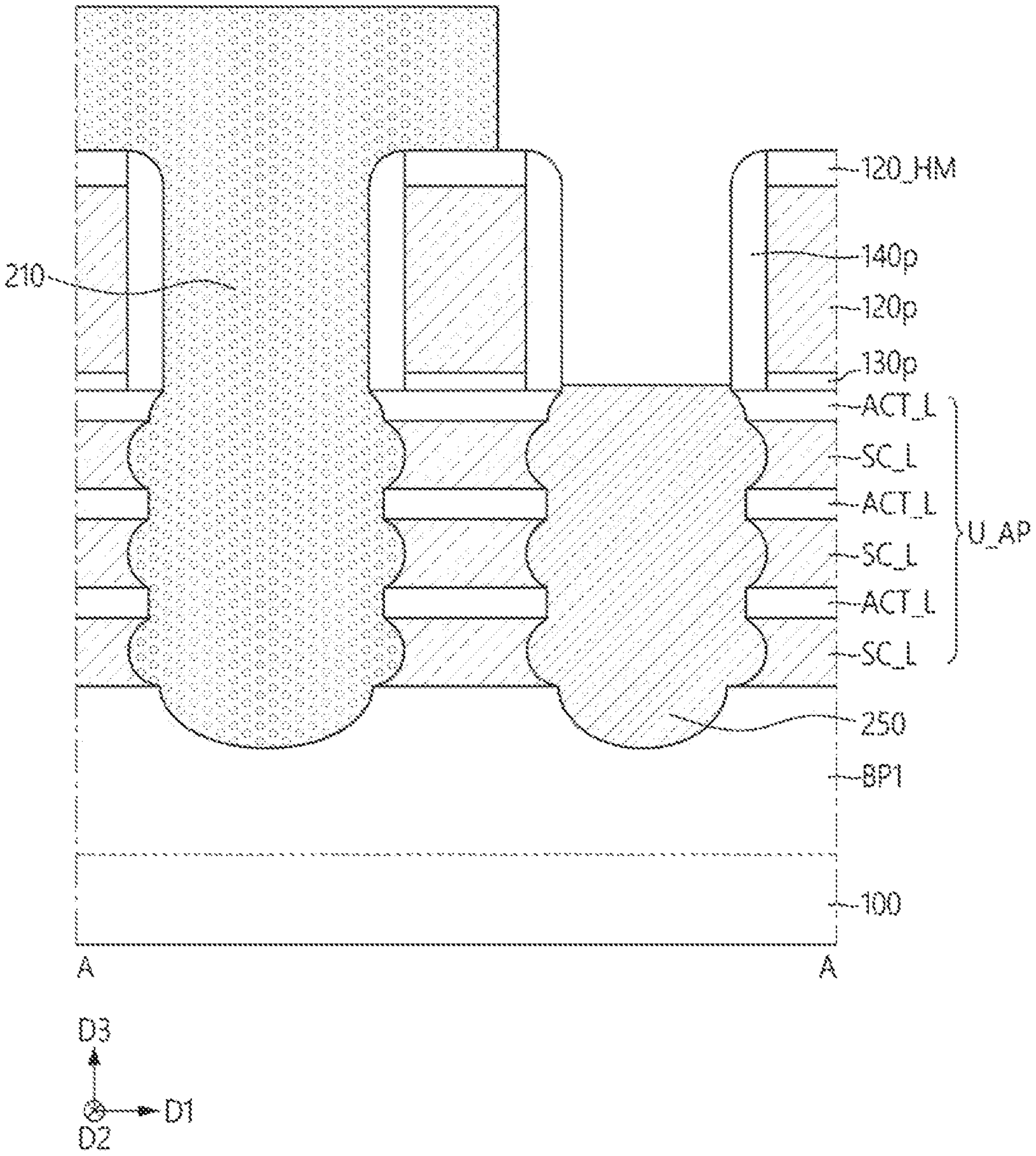

Referring to FIG. 28, the second source/drain pattern 250 is formed.

The second source/drain pattern 250 may be formed inside the second source/drain recess 250R. The second source/drain pattern 250 may fill the second source/drain recess 250R. The upper face of the second source/drain pattern 250 may protrude above the upper face of the active pattern ACT_L placed at the uppermost part of the active patterns ACT_L. The second source/drain pattern 250 is connected to the sacrificial pattern SC_L and the active pattern ACT_L. For example, the second source/drain pattern 250 contacts the sacrificial pattern SC_L and the active pattern ACT_L.

Figure 29:
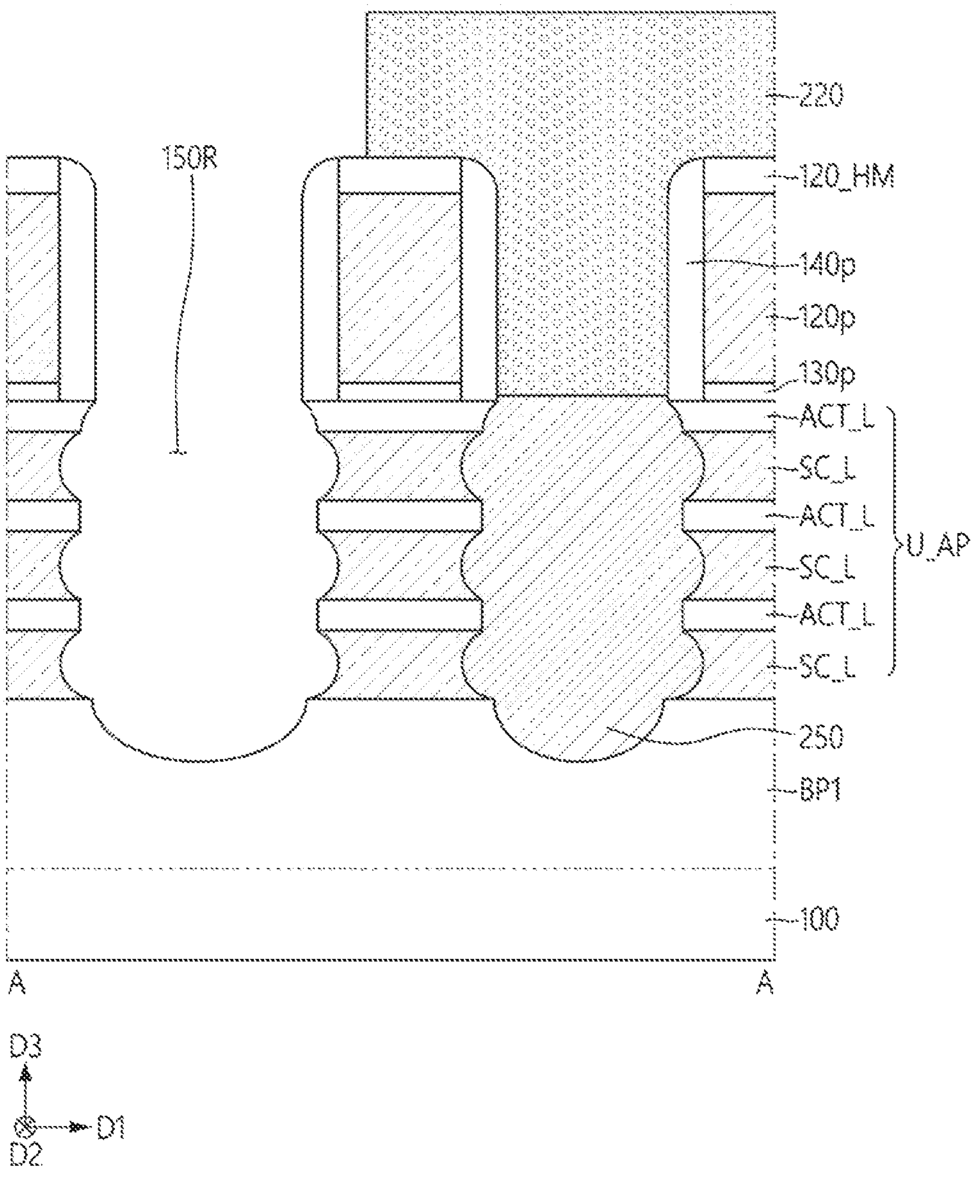

Referring to FIG. 29, the first mask 210 is removed and the second mask 220 is formed.

Figure 30:
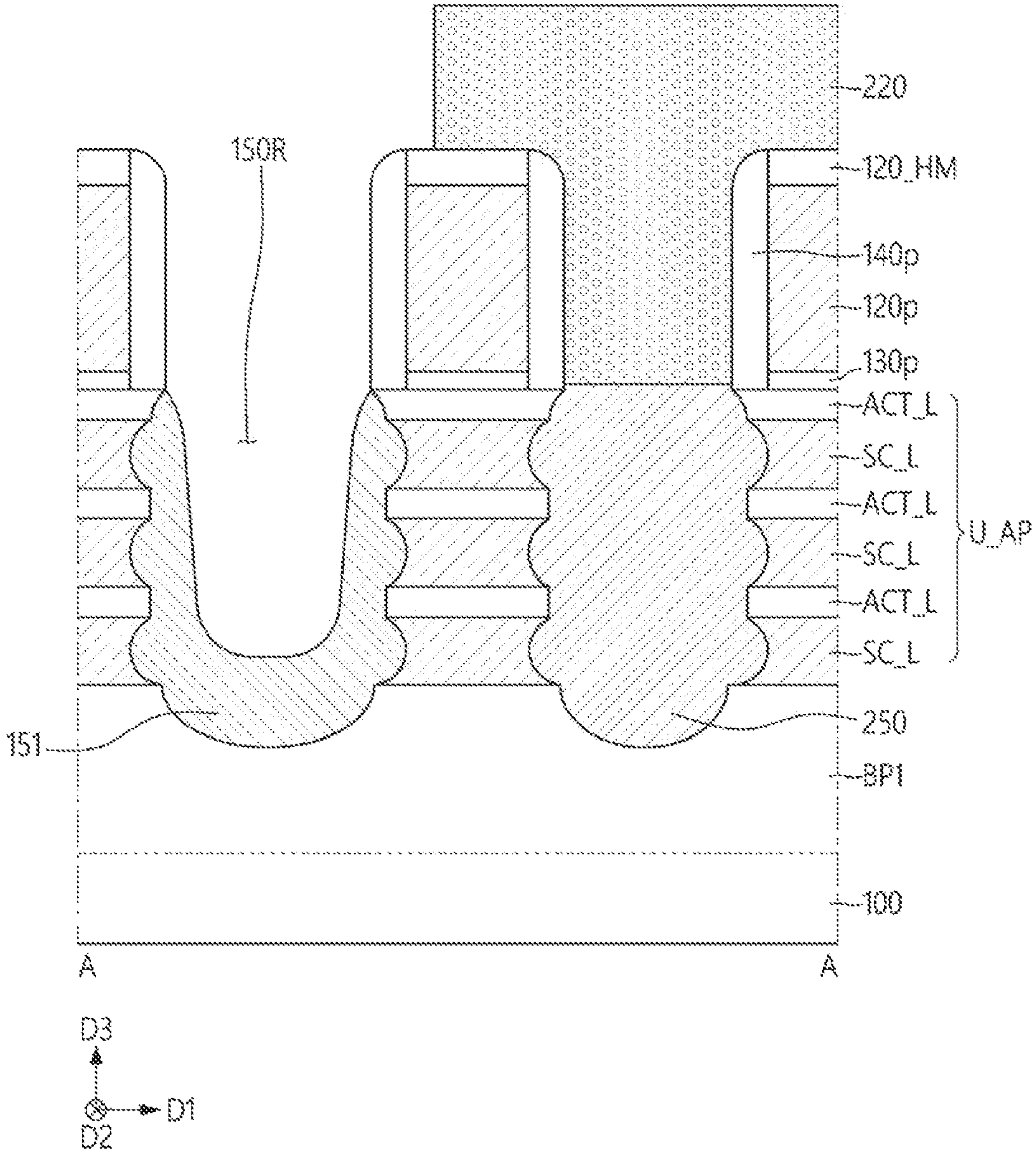

Referring to FIG. 30, the first layer 151 is formed.

The first layer 151 may be formed inside the first source/drain recess 150R. The first layer 151 may extend along the profile of the first source/drain recess 150R. The first layer 151 may be formed along the bottom face and inner side faces of the first source/drain recess 150R. The first layer 151 is connected to the sacrificial pattern SC_L and the active pattern ACT_L. For example, the first layer 151 may contact the sacrificial pattern SC_L and the active pattern ACT_L.

Figure 31:
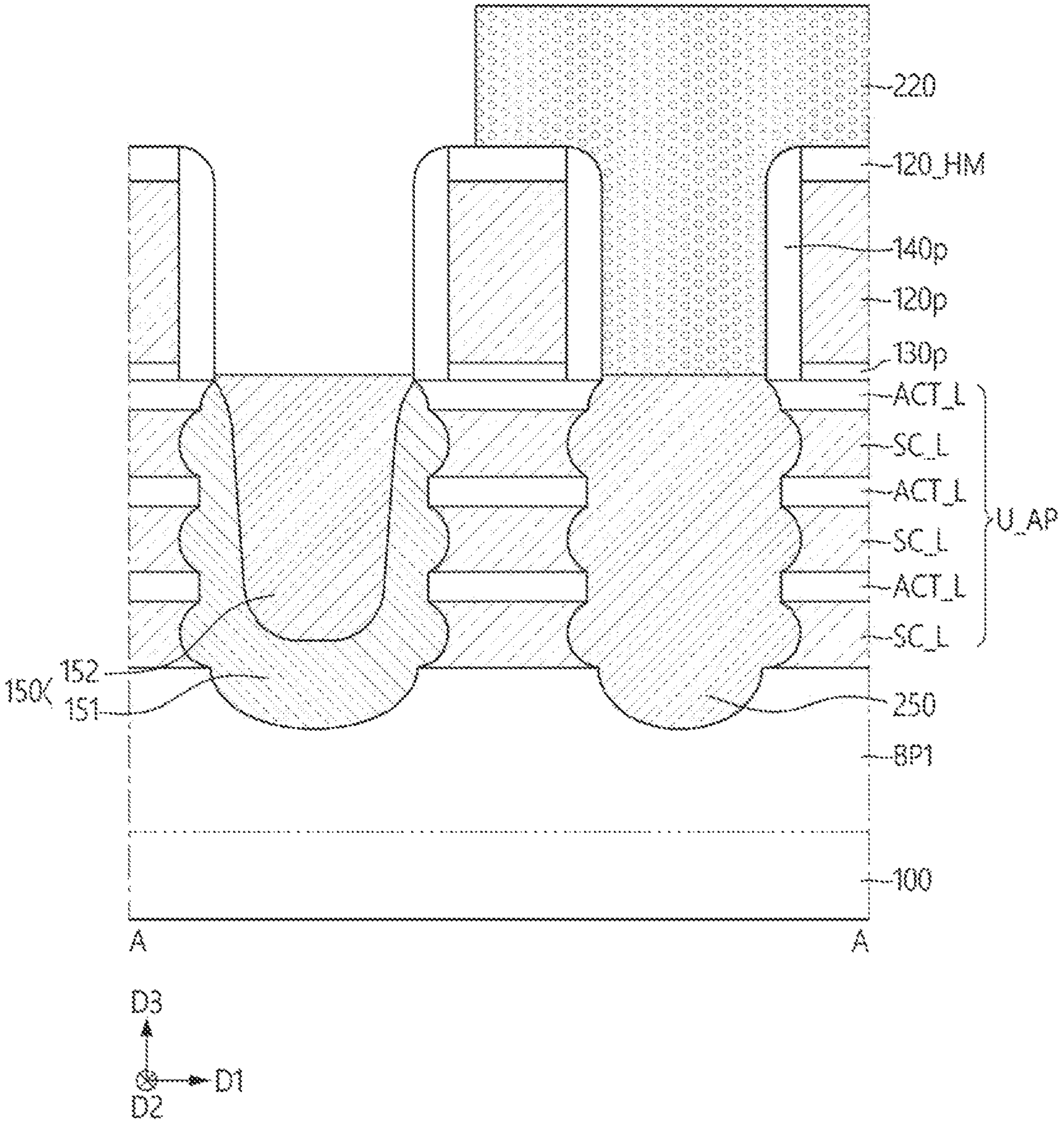

Referring to FIG. 31, a second layer 152 is formed on the first layer 151.

Figure 32:
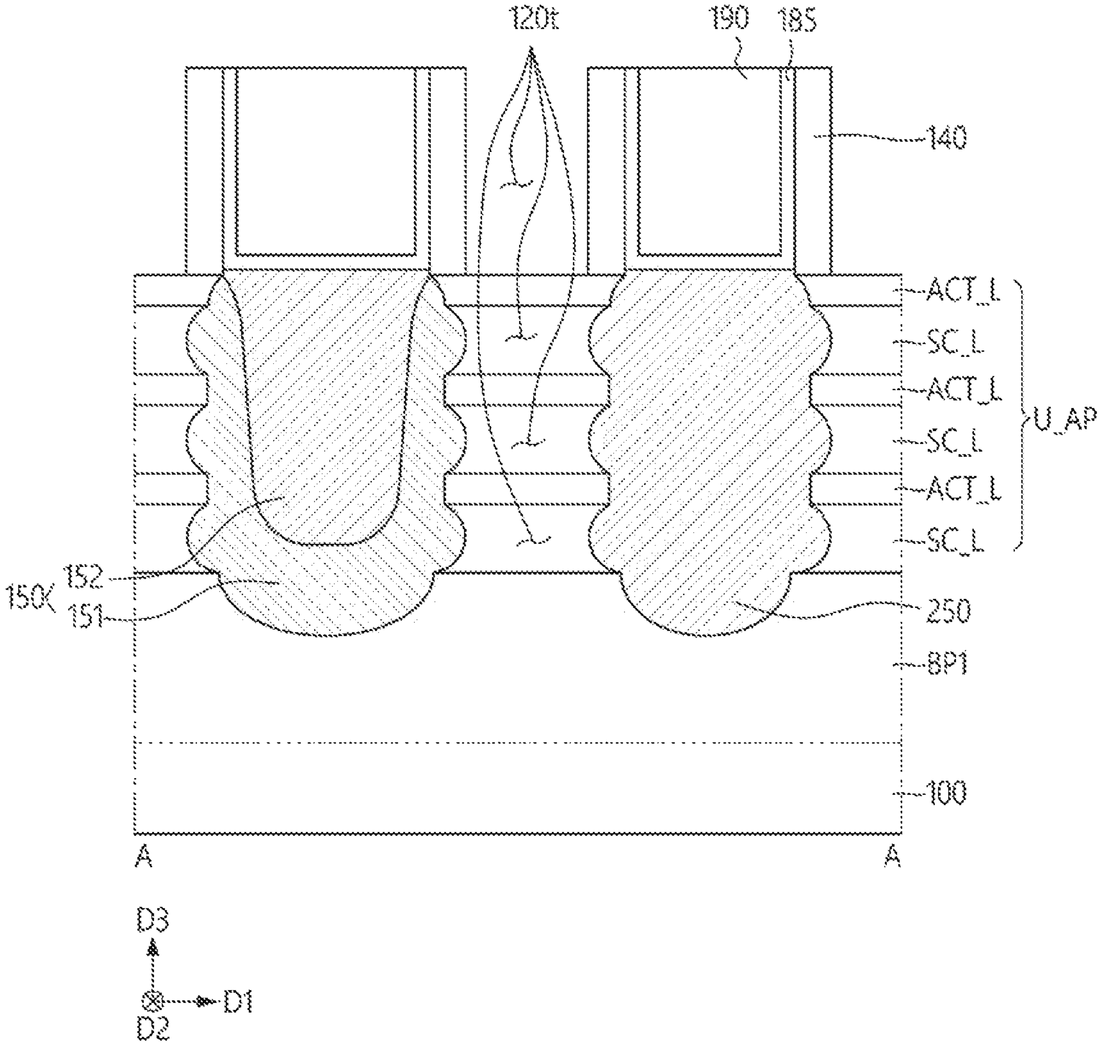

Referring to FIG. 32, the second mask 220 is removed, and the source/drain etching stop film 185 and the interlayer insulating film 190 are formed. A part of the interlayer insulating film 190, a part of the source/drain etching stop film 185, and the dummy gate capping film 120_HM are removed to expose the upper face of the dummy gate electrode 120*p*, and the dummy gate insulating film 130*p* and the dummy gate electrode 120*p* are removed.

Next, referring to FIG. 5, the sacrificial pattern SC_L is then removed to form a first sheet pattern NS1. The sacrificial pattern SC_L is removed, and the first gate insulating film 130 and the first gate electrode 120 are formed. The first gate insulating film 130 and the first gate electrode 120 are disposed between the first source/drain pattern 150 and the second source/drain pattern 250 that are between the first sheet patterns NS1.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:

an active pattern which includes a first lower pattern and a plurality of first sheet patterns, wherein the first lower pattern extends in a first direction, and the plurality of first sheet patterns are spaced apart from the first lower pattern in a second direction crossing the first direction;

a gate structure, which includes a gate electrode and a gate spacer extending in a third direction intersecting the first direction and the second direction, disposed on the active pattern;

a first source/drain pattern disposed adjacent to a first side of the gate structure; and a second source/drain pattern which is spaced apart from the first source/drain pattern with the gate structure interposed therebetween, wherein the first source/drain pattern includes:

a lower layer including a first conductivity type and disposed on the first lower pattern, and an upper layer including a second conductivity type, which is different from the first conductivity type, and disposed on the lower layer, and a capping film including the first conductivity type and disposed on the upper layer, wherein the second source/drain pattern has the second conductivity type.

2. The semiconductor device of claim 1, further comprising:

a first source/drain contact disposed on the first source/drain pattern, wherein a first lower surface of the first source/drain contact is disposed inside the upper layer.

3. The semiconductor device of claim 2, further comprising:

a second source/drain contact disposed on the second source/drain pattern, wherein a height of the first lower surface of the first source/drain contact and a height of a second lower surface of the second source/drain contact are different from each other, on the basis of an upper surface of the first lower pattern.

4. The semiconductor device of claim 1, wherein the plurality of first sheet patterns do not include impurities of the first conductivity type and impurities of the second conductivity type.

5. The semiconductor device of claim 1, wherein the second source/drain pattern includes a plurality of films of the second conductivity type.

6. The semiconductor device of claim 1, further comprising:

an internal spacer disposed between the first source/drain pattern and the gate electrod, and between the plurality of first sheet patterns.

7. The semiconductor device of claim 6, wherein a first width, in the second direction, of a first portion of the gate electrode disposed above the plurality of first sheet patterns on the basis of an upper surface of the first lower pattern is greater than a second width, in the second direction, of a second portion of the gate electrode disposed between the plurality of first sheet patterns.

8. The semiconductor device of claim 1, wherein a width of the first source/drain pattern is greater than a width of the second source/drain pattern.

9. The semiconductor device of claim 1, wherein a lower surface of the first source/drain pattern is disposed lower than a lower surface of the second source/drain pattern, on the basis of an upper surface of the first lower pattern.

10. The semiconductor device of claim 1, wherein an upper surface of the first source/drain pattern and an upper surface of the second source/drain pattern are disposed above an uppermost surface of the plurality of first sheet patterns, on the basis of an upper face of the first lower pattern.

11. The semiconductor device of claim 1, wherein the upper layer of the first source/drain pattern is not in contact with side surfaces of the plurality of first sheet patterns, and the lower layer of the first source/drain pattern is in contact with the plurality of first sheet patterns.

12. The semiconductor device of claim 11, wherein the lower layer at least partially surrounds a side surface and a lower surface of the upper layer.

13. A semiconductor device comprising:

an active pattern which includes a first lower pattern and a plurality of first sheet patterns, wherein the first lower pattern extends in a first direction, and the plurality of first sheet patterns are spaced apart from the first lower pattern in a second direction;

a gate structure, which includes a gate electrode and a gate spacer extending in a third direction intersecting the first direction and the second direction, disposed on the active pattern;

a first source/drain pattern disposed adjacent to a first side of the gate structure; and a second source/drain pattern which is spaced apart from the first source/drain pattern with the gate structure interposed therebetween, wherein the first source/drain pattern includes:

a first layer including a first conductivity type; and a second layer including a second conductivity type different from the first conductivity type, and further includes a third layer including the first conductivity type, wherein the second layer is surrounded by the first layer and the third layer, wherein the second source/drain pattern has the second conductivity type, and wherein side surfaces of the plurality of first sheet patterns are in contact with the first layer and the second source/drain pattern, and are not in contact with the second layer.

14. The semiconductor device of claim 13, wherein the second layer of the first source/drain pattern overlaps the plurality of first sheet patterns in the first direction.

15. The semiconductor device of claim 13, further comprising:

a first source/drain contact disposed on the first source/drain pattern, wherein a lower surface of the first source/drain contact is disposed inside the second layer.

16. The semiconductor device of claim 13, wherein the plurality of first sheet patterns do not include impurities of the first conductivity type and impurities of the second conductivity type.

17. The semiconductor device of claim 13, wherein the second source/drain pattern includes a single film of the second conductivity type.

18. A semiconductor device comprising:

an active pattern which includes a first lower pattern and a plurality of first sheet patterns, wherein the first lower pattern extends in a first direction, and the plurality of first sheet patterns are spaced apart from the first lower pattern in a second direction crossing the first direction;

a gate structure, which includes a gate electrode and a gate spacer extending in a third direction intersecting the first direction and the second direction, disposed on the active pattern;

a first source/drain pattern disposed adjacent to a first side of the gate structure;

a second source/drain pattern which is spaced apart from the first source/drain pattern with the gate structure interposed therebetween;

a first source/drain contact disposed on the first source/drain pattern; and an internal spacer which is disposed between the plurality of first sheet patterns in the second direction, and is disposed between the first source/drain pattern and the gate electrode in the first direction, and between the second source/drain pattern and the gate electrode, wherein the first source/drain pattern includes:

a first layer including a first conductive type and disposed on the first lower pattern;

a second layer including a second conductivity type, which is different from the first conductivity type, and disposed on the first layer; and a third layer including the first conductivity type and disposed on the second layer, wherein the second source/drain pattern has the second conductivity type, wherein the first layer surrounds a side surface and a lower surface of the second layer, wherein the third layer covers an upper surface of the second layer, and wherein the first source/drain contact penetrates the third layer, and a lower surface of the first source/drain contact is disposed inside the second layer.

* * * * *